(12) United States Patent
Williams et al.

(10) Patent No.: US 7,692,215 B2
(45) Date of Patent: Apr. 6, 2010

(54) MIXED-SCALE ELECTRONIC INTERFACE

(75) Inventors: R. Stanley Williams, Portola Valley, CA (US); Gregory S. Snider, Mountain View, CA (US); Duncan Stewart, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 389 days.

(21) Appl. No.: 11/701,086

(22) Filed: Jan. 31, 2007

(65) Prior Publication Data

US 2007/0205483 A1  Sep. 6, 2007

Related U.S. Application Data

(63) Continuation-in-part of application No. 11/342,076, filed on Jan. 27, 2006, now Pat. No. 7,544,977.

(51) Int. Cl.
*H01L 27/10* (2006.01)
*H01L 29/73* (2006.01)

(52) U.S. Cl. .................... 257/208; 257/211; 257/773

(58) Field of Classification Search ................ 257/208, 257/210, 211, 773–776, 786, E23.01, E23.024, 257/E23.141; 977/707, 712, 762
See application file for complete search history.

(56) References Cited

U.S. PATENT DOCUMENTS

| 7,256,435 B1 * | 8/2007 | Kornilovich et al. ........ 257/208 |
| 7,307,271 B2 * | 12/2007 | Islam et al. .................... 257/14 |
| 7,423,285 B2 * | 9/2008 | Ohki ............................ 257/41 |

* cited by examiner

*Primary Examiner*—Hung Vu

(57) ABSTRACT

Embodiments of the present invention are directed to mixed-scale electronic interfaces, included in integrated circuits and other electronic devices, that provide for dense electrical interconnection between microscale features of a predominantly microscale or submicroscale layer and nanoscale features of a predominantly nanoscale layer. The predominantly nanoscale layer, in one embodiment of the present invention, comprises a tessellated pattern of submicroscale or microscale pads densely interconnected by nanowire junctions between sets of parallel, closely spaced nanowire bundles. The predominantly submicroscale or microscale layer includes pins positioned complementarily to the submicroscale or microscale pads in the predominantly nanoscale layer. Pins can be configured according to any periodic tiling of the microscale layer.

7 Claims, 47 Drawing Sheets

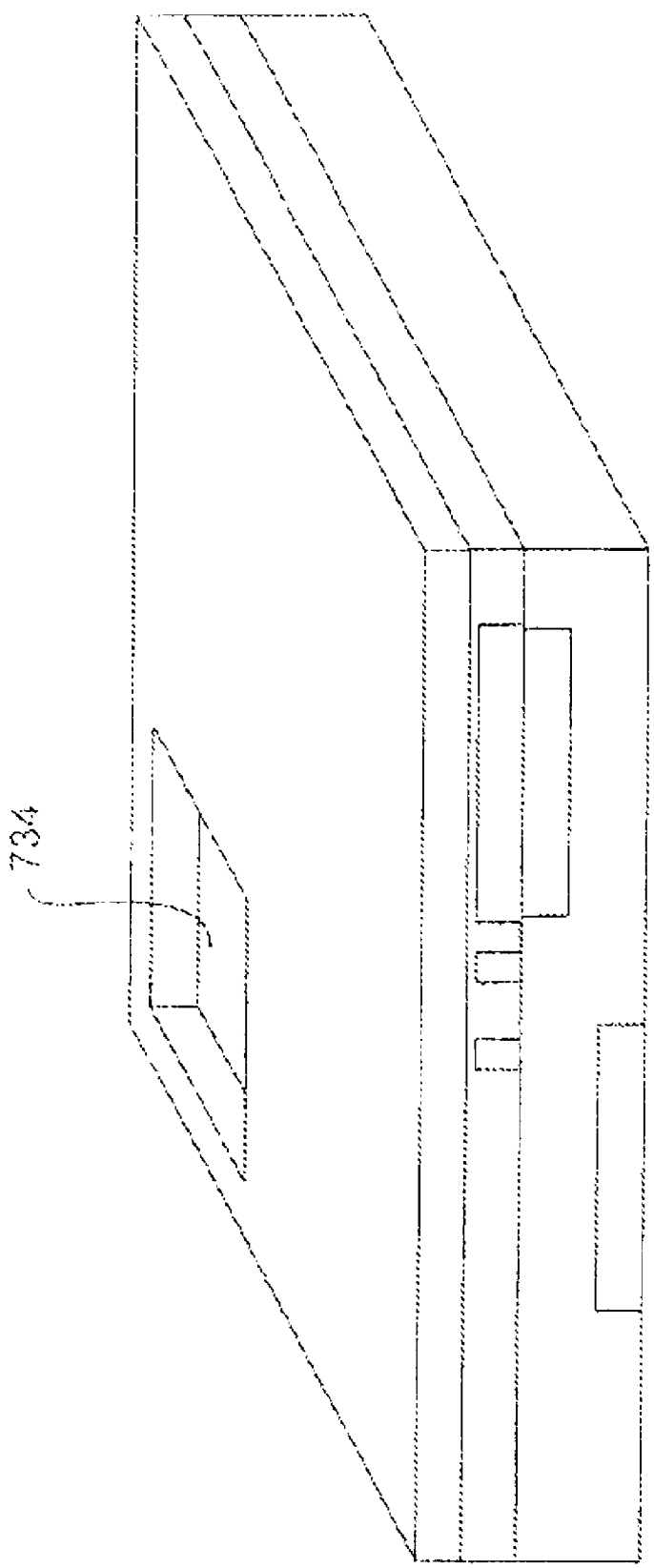

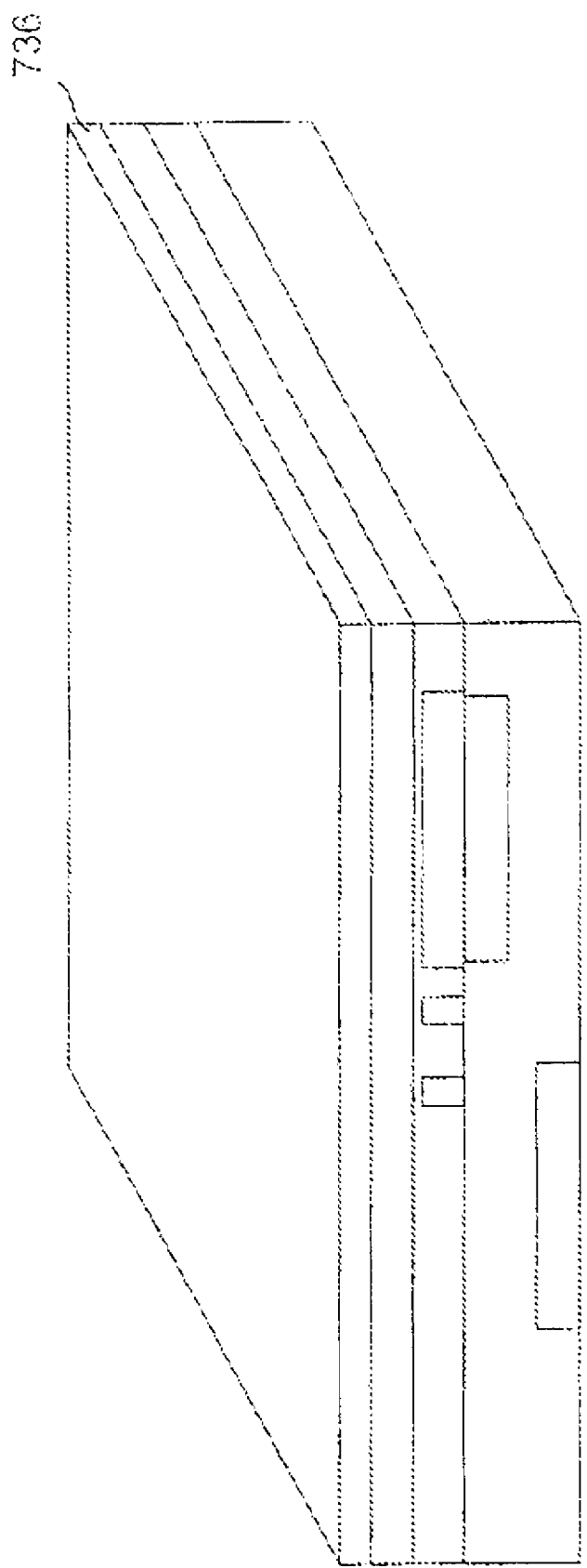

dihedral tilings

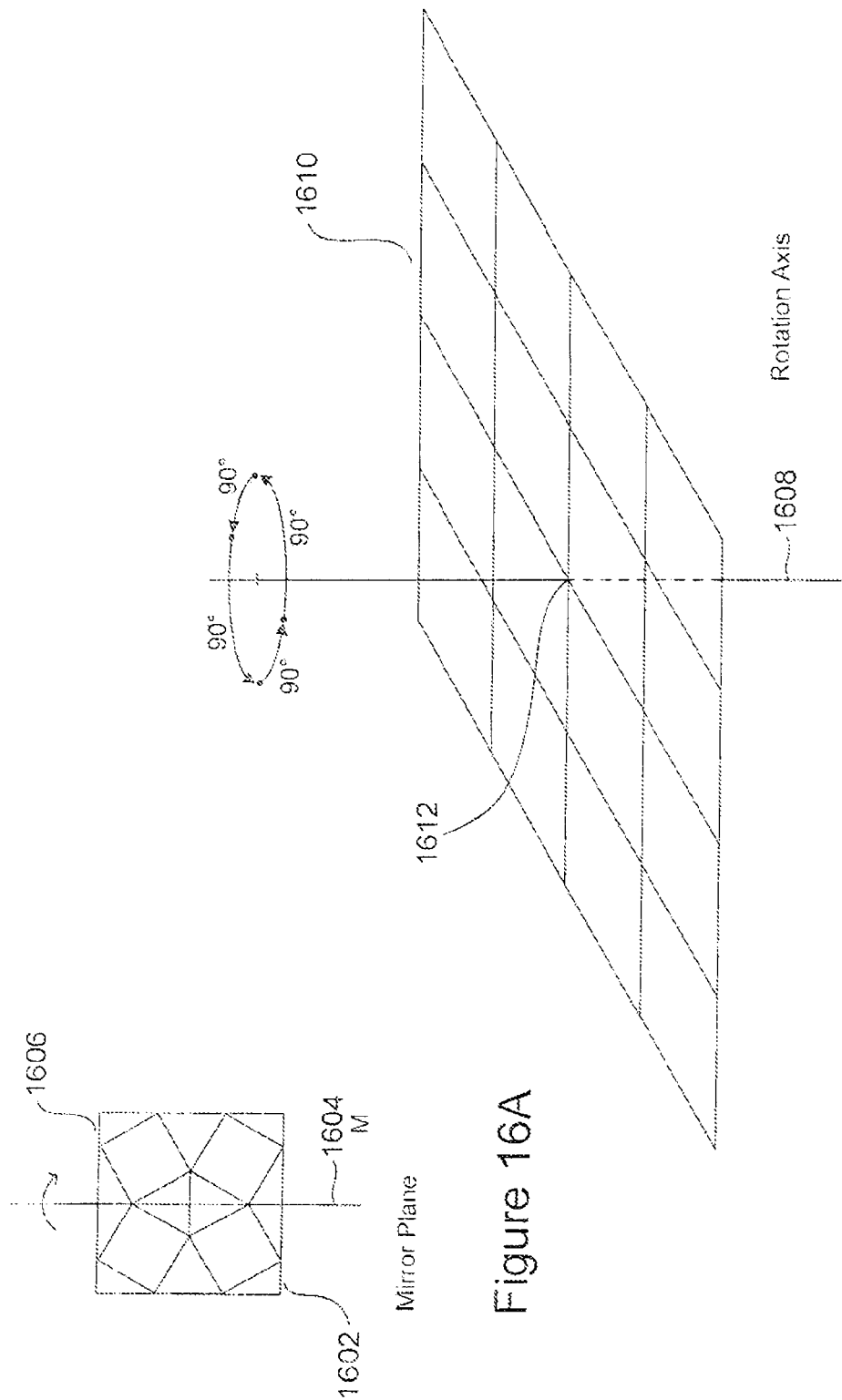

MIXED-SCALE ELECTRONIC INTERFACE

CROSS-REFERENCE TO RELATED APPLICATION

This application is a continuation-in-part to U.S. application Ser. No. 11/342,076, filed Jan. 27, 2006 now U.S. Pat. No. 7,544,977.

TECHNICAL FIELD

The present invention is related to integrated circuits and other electronic devices and, in particular, to a mixed-scale interface suitable for densely interconnecting nanoscale electronics with microscale electronics within an integrated circuit or other electronic device.

BACKGROUND OF THE INVENTION

As manufacturers and designers of integrated circuits continue to relentlessly decrease the size of integrated-circuit features, such as transistors and signal lines, and to correspondingly increase the density at which features can be fabricated within integrated circuits, they are beginning to approach fundamental physical limits to further decreases in feature sizes for integrated circuits fabricated by conventional photolithography techniques. Research efforts have, during the past decade, turned to new, non-photolithography-based techniques for fabricating nanoscale electronics that allow for fabrication of significantly smaller features than the smallest features currently fabricated by photolithographic techniques. In one approach to designing and fabricating nanoscale electronics, nanowire crossbars comprising multiple layers of parallel nanowires are fabricated by self-assembly or self-orientation with molecular-scale widths on surfaces. The grid-like nanowire crossbars provide a two-dimensional array of nanowire junctions at the closest points of contact between nanowires of a first layer, oriented in a first direction, and nanowires of a second layer, oriented in a second direction approximately perpendicular to the first direction. The nanowire junctions, comprising a small number of molecules of a nanonwire-junction substance, can be fabricated to have properties of resistors, diodes, transistors, and other familiar components of conventional electronic circuits.

Many different prototype nanoscale electronic circuits have been produced in research and development environments, and continued research efforts are producing palettes of nanoscale-electronic components and features of increasing sizes, a rich variety of useful nanoscale-electronic component organizations, and a variety of fabrication methods for producing nanoscale electronic components and devices. However, practical, commercial electronic devices need to include large scale, microscale, and submicroscale components and circuits that interface to nanoscale electronic devices and circuitry. In many cases, devising reliable and cost-effective interfaces between microscale and submicroscale electronics and nanoscale electronics has proven to be more difficult than the design and fabrication of nanoscale electronic devices.

One approach to interfacing microscale and submicroscale electronics to nanoscale electronics involves the use of microscale-to-nanoscale demultiplexers. FIG. 1 illustrates an exemplary demultiplexer/nanowire-crossbar configuration that allows individual nanowire junctions within a nanowire crossbar to be accessed by address signals input to microscale signal lines. As shown in FIG. 1, a first demultiplexer 102 interconnects a small number of microscale address signal lines 104 to a much larger number of parallel nanowires 106 within a nanowire crossbar 108. A second demultiplexer 110 interconnects a second set of microscale address signal lines 112 to a second set of parallel nanowires 114 within the nanowire crossbar 108. Various nanowire junctions may be configured to have particular electronic properties, including properties characteristic of transistors, resistors, diodes, and other such electronic components, represented in FIG. 1 with filled circles, such as filled circle 116, overlying particular nanowire junctions. In the exemplary microscale/nanoscale interface shown in FIG. 1, the four address lines (e.g. address lines 104) input to the demultiplexer can carry any of $2^4$ or 16 different digital patterns, or addresses, of high and low voltage or current binary signals on each address line. The demultiplexer can translate each different perceived address into a pattern of high and low signals output to the nanowires to which it is connected. Typically, a demultiplexer outputs a high, or Boolean "1," signal to a single nanowire corresponding to a four-bit nanowire address received through the microscale address signal lines, and low, or Boolean "0" signals to the remaining, non-addressed nanowires. By arranging the demultiplexers, as shown in FIG. 1, each nanowire junction within the nanowire crossbar can be individually addressed by a pair of addresses, one address received on the first set of address signal lines 104 and a second address received on the second set of address signal lines 112. The nanowire crossbar can be configured arbitrarily to implement any of a large number of different possible circuits which output result signals to selected nanowires. The nanowire crossbar in FIG. 1 is exemplary of the overall organization, and is not intended to represent any particular circuit or device.

Working prototypes of demultiplexer-based microscale/nanoscale interfaces have been developed, and the demultiplexer-based microscale/nanoscale interface has been shown to be a feasible and effective nanoscale/microscale interface technique. However, in general, addressing of a single nanowire by each multiplexer at each instant in time represents a significant bandwidth constriction since, as shown in the example shown in FIG. 1, only one junction may be addressed at a time. Demultiplexer-based nanoscale/microscale interfaces may therefore represent significant bandwidth bottlenecks within mixed-scale microelectronic devices. The demultiplexer-based approach may additionally add design and fabrication overheads, cost, and reliability problems to mixed-scale electronic devices with densely interconnected microscale and nanoscale circuits and functional modules. Therefore, researchers and developers of mixed-scale electronic devices continue to seek more reliable, more easily fabricated, and less bandwidth-constricting nanoscale/microscale interfaces for use in mixed-scale electronic devices.

SUMMARY OF THE INVENTION

Embodiments of the present invention are directed to mixed-scale electronic interfaces, included in integrated circuits and other electronic devices, that provide for dense electrical interconnection between microscale features of a predominantly microscale or submicroscale layer and nanoscale features of a predominantly nanoscale layer. The predominantly nanoscale layer, in one embodiment of the present invention, comprises a tessellated pattern of submicroscale or microscale pads densely interconnected by nanowire junctions between sets of parallel, closely spaced nanowire bundles. The predominantly submicroscale or microscale layer includes pins positioned complementarily to the submicroscale or microscale pads in the predominantly nanoscale layer. Pins can be configured according to any periodic tiling of the microscale layer. More complex mixed-scale electronic interfaces that include two or more microscale or submicroscale layers and/or two or more nanoscale layers can also be designed and fabricated according to methods of the present invention.

BRIEF DESCRIPTION OF THE DRAWINGS

FIGS. 16A-D illustrate one small set of symmetry operations that can be used, in combination, to generate the overall symmetry of any possible periodic tiling.

DETAILED DESCRIPTION OF THE INVENTION

Embodiments of the present invention are directed to nanoscale/microscale interfaces that permit dense interconnections between microscale and submicroscale features and logic and nanoscale features and logic within an integrated circuit or other electronic device. In the current discussion, the term "nanoscale" refers to features and components with a least one dimension smaller than 100 nanometers. Alternatively, the term "nanoscale" may refer to features and components with at least one dimension smaller than 50 nanometers, and, in certain cases, less than 10 nanometers. The term "submicroscale" generally refers to features and components with at least on dimension smaller than 1 micron, and the term "microscale" refers to features and components with dimensions equal to, or greater than, 1 micron. In general, microscale and submicroscale features and components can be fabricated by conventional photolithographic techniques, but nanoscale components and features can generally be fabricated, currently, using nanoimprint techniques or other non-photolithographic techniques. A described nanoscale/microscale-interface embodiment of the present invention interconnects pads in a predominantly nanoscale layer with correspondingly regularly patterned microscale or submicroscale pins in a predominantly submicroscale or microscale layer. Each pad in the predominantly nanoscale layer may be interconnected through nanowire-junctions with a large number of neighboring pads through nanowire junctions in lattice-like channels of nanowires. A pad within the predominantly nanoscale layer can be accessed by conventional submicroscale or microscale electronics in the second, predominantly microscale or submicroscale layer via a submicroscale or microscale pin.

Figure 1:
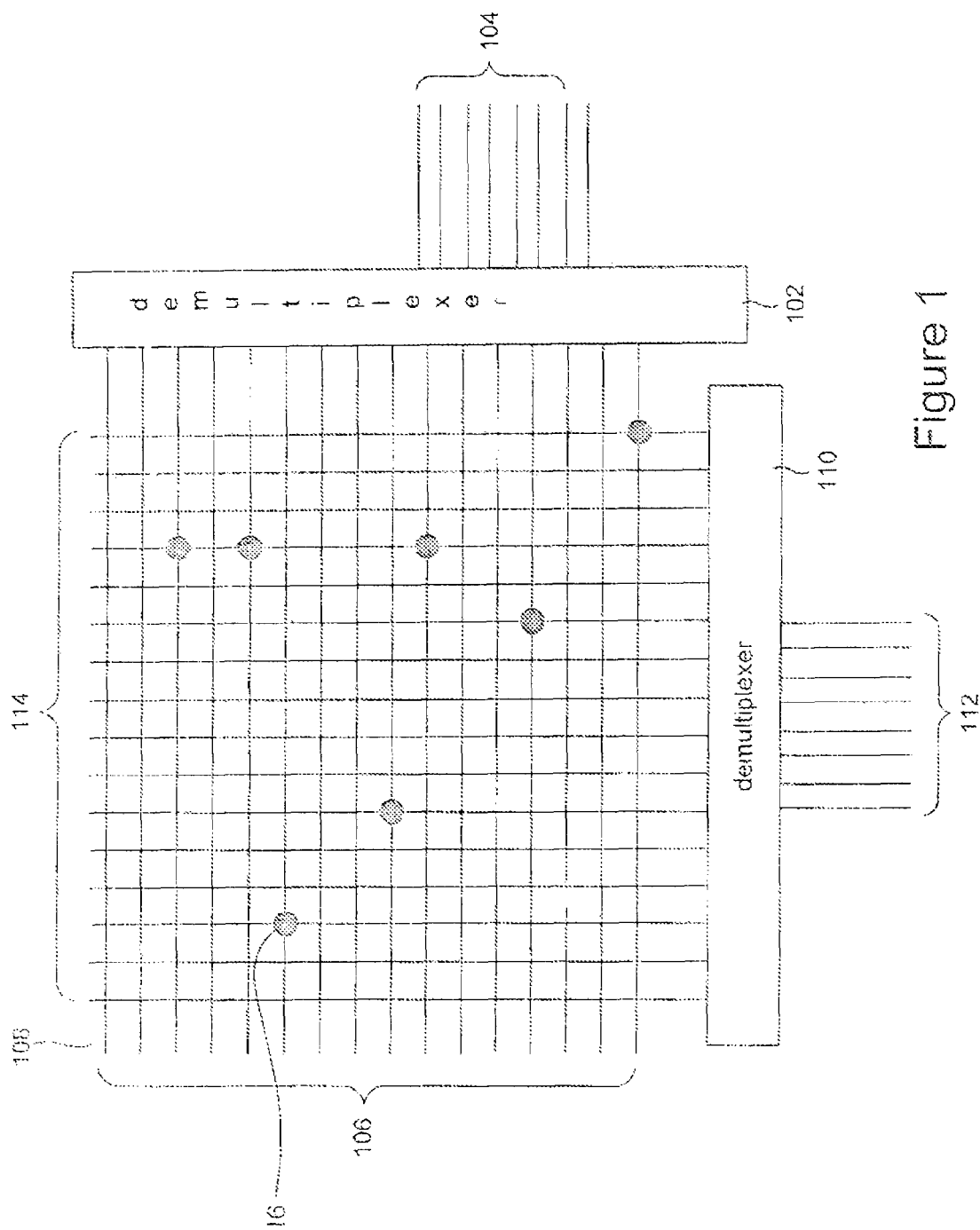
FIG. 1 illustrates an exemplary demultiplexer/nanowire-crossbar configuration that allows individual nanowire junctions within a nanowire crossbar to be accessed by address signals input to microscale signal lines.
Figure 2:
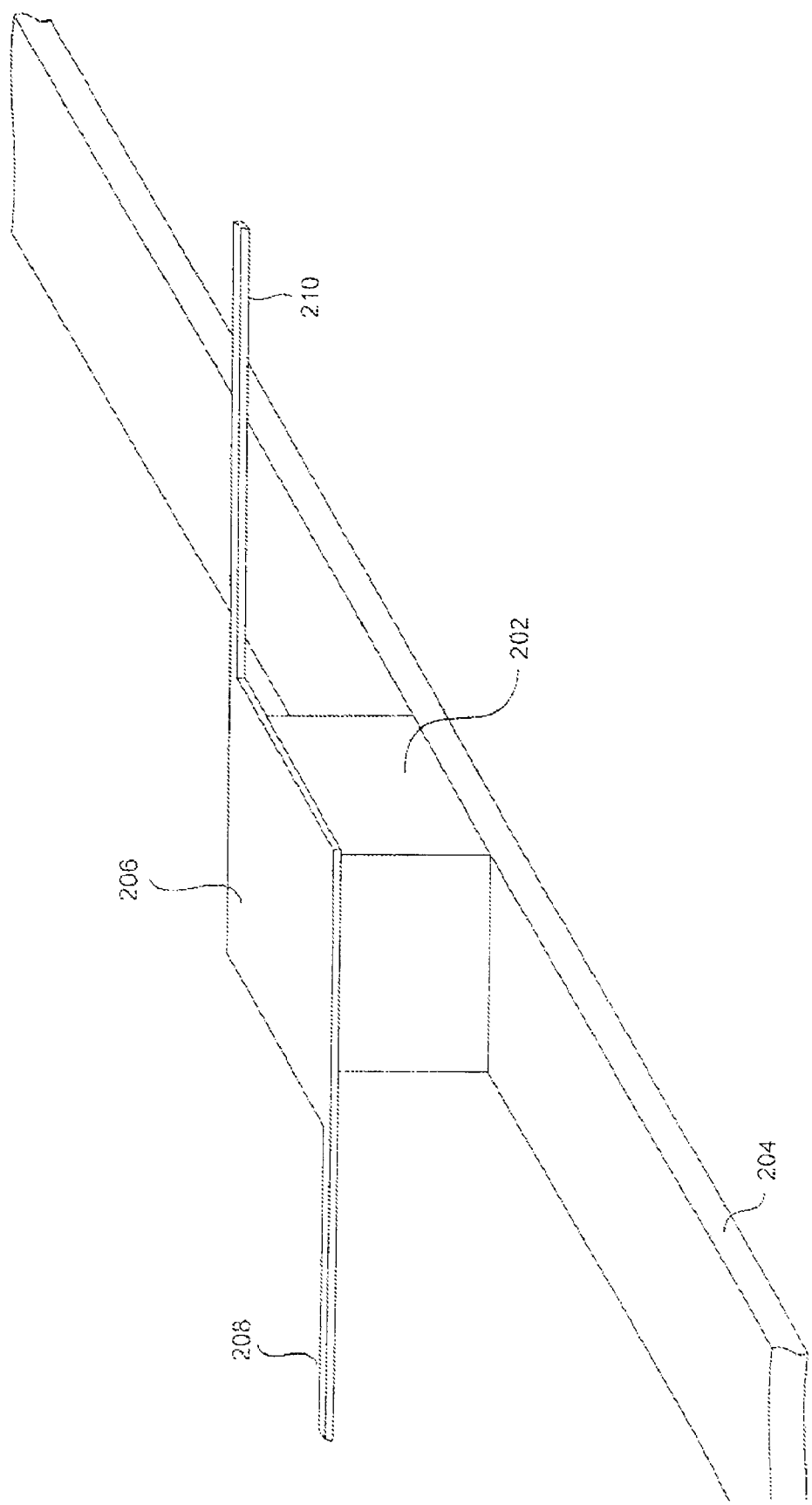
FIG. 2 illustrates a single pin/pad interface within a two-layer nanoscale/macroscale-interface embodiment of the present invention.

FIG. 2 illustrates a single pin/pad interface within a two-layer nanoscale/macroscale-interface embodiment of the present invention. As shown in FIG. 2, a submicroscale or microscale pin 202 connects to a submicroscale or microscale signal line 204. The pin 202 and signal line 204 are both embedded within the predominantly submicroscale or microscale layer of the two-layer nanoscale/microscale-interface embodiment of the present invention. The pin 202 also electrically contacts a pad 206 that is, in turn, interconnected with a first nanowire 208 and a second nanowire 210. The pad 206 and attached nanowires 208 and 210 together compose a pad-interconnected-nanowire unit ("PINU") of one sub-layer of the predominantly nanoscale layer of the two-layer nanoscale/macroscale-interface embodiment of the present invention.

Figure 3:
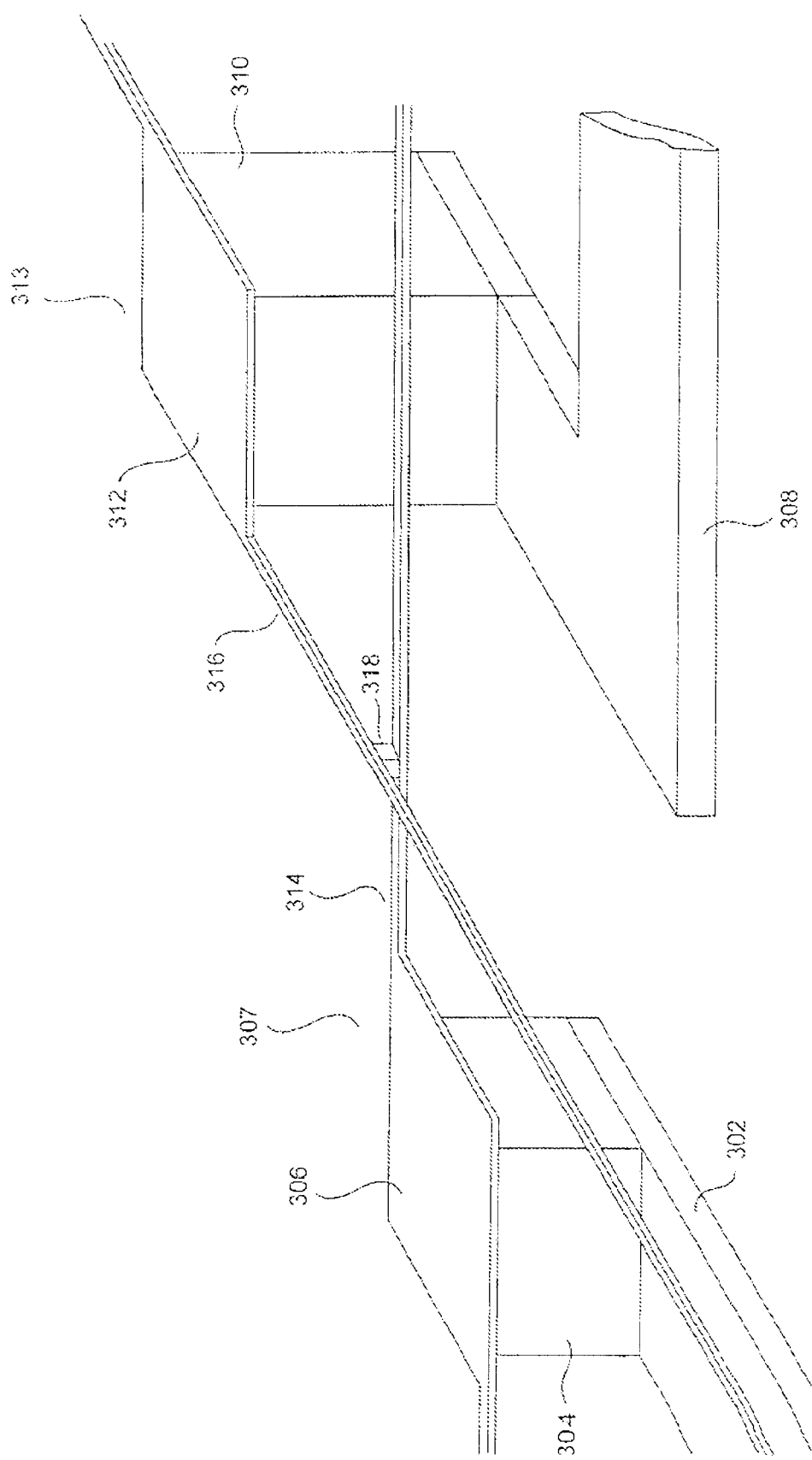
FIG. 3 illustrates, in the same fashion as FIG. 2, two pin/pad interfaces interconnected by a nanowire junction within a nanoscale/microscale-interface embodiment of the present invention.

FIG. 3 illustrates, in the same fashion as FIG. 2, two pad/pin interfaces within a nanoscale/macroscale-interface embodiment of the present invention. In FIG. 3, a first microscale or submicroscale signal line 302 electrically contacts a first pin 304. The first pin also electrically contacts the pad 306 of a first PINU 307. The first PINU 307 resides in a first sub-layer of the predominantly nanoscale layer of the nanoscale/macroscale interface. A second submicroscale or microscale signal line 308 electrically contacts a second pin 310. The second pin also electrically contacts the pad 312 of a second PINU 313. The second PINU 313 resides within a second sub-layer of the predominantly nanoscale layer of the two-layer nanoscale/macroscale interface. Two nanowires 314 and 316 of the two PINUs 307 and 313 intersect at a nanowire junction 318, which, like the nanowire junctions in nanowire crossbars, may comprise one or a small number of molecules that implement a passive or active nanoscale electrical component, such as a resistor, a variable-resistance resistor, a diode, a transistor, or other passive or active component.

In many embodiments of the present invention, pairs of pins of the predominantly microscale layer of a two-layer nanoscale/microscale interface are electrically interconnected via a pair of PINUs and a single nanowire junction. In certain types of electronic devices that incorporate two-layer nanoscale/macroscale interfaces of the present invention, including mixed-scale integrated circuits, the predominantly microscale and submicroscale layer may implement various types of logic and functional units, and the predominantly nanoscale layer may serve primarily to interconnect the various submicroscale or microscale components and logic. By using nanoscale electronics for component and logic interconnection, the area and power consumption of a mixed-scale integrated circuit or other electronic device can both be significantly decreased.

Figure 4A:
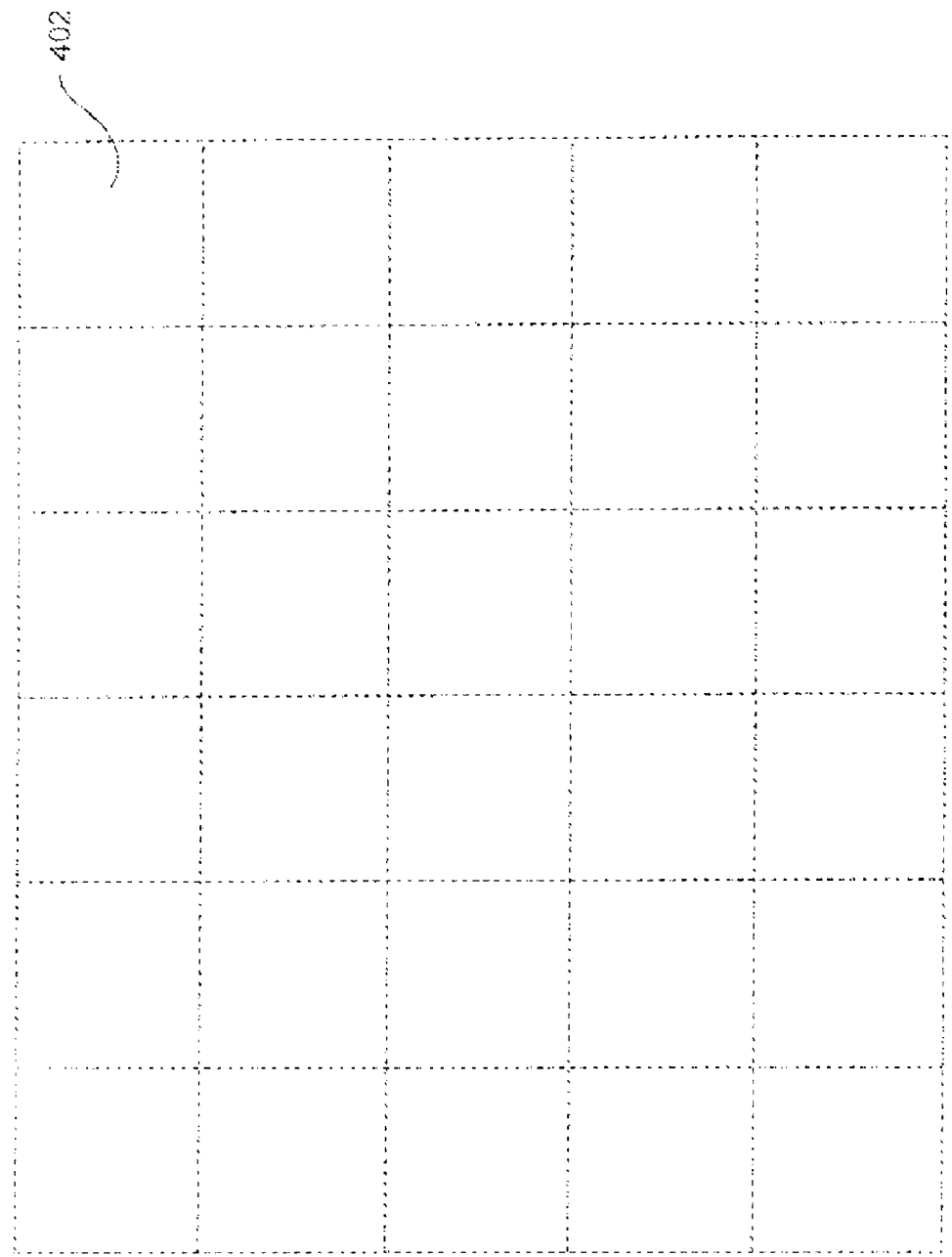
FIGS. 4A-D illustrate the overall organization and patterning of one class of two-layer nanoscale/macroscale-interface embodiments of the present invention.

FIGS. 4A-D illustrate the overall organization and patterning of one class of two-layer nanoscale/macroscale-interface embodiments of the present invention. As shown in FIG. 4A, the predominantly submicroscale or microscale layer of the two-layer nanoscale/microscale interface can be considered to be organized into square or rectangular cells to form a rectilinear grid of microscale cells. FIG. 4A shows a tiny portion of the predominantly microscale layer of a two-layer nanoscale/macroscale interface that includes 30 microscale cells, such as microscale cell 402. The rectilinear organization of the predominantly microscale layer reflects only the arrangements of submicroscale or microscale pins within the predominantly microscale layer. The underlying submicroscale or microscale circuitry and components may not be so regularly patterned and may not otherwise conform to the rectilinear pattern illustrated in FIG. 4A. In general, each microscale cell contains a small number of submicroscale or microscale pins that are identically arranged and positioned in each microscale cell of the rectilinear grid. In subsequent figures, two-pin cells are illustrated. In various prototype designs of functional devices, four-pin microscale cells are employed. Because the pins are identically arranged in each microscale cell, the pins also form a regular pattern across the surface of the predominantly microscale layer.

Figure 4B:
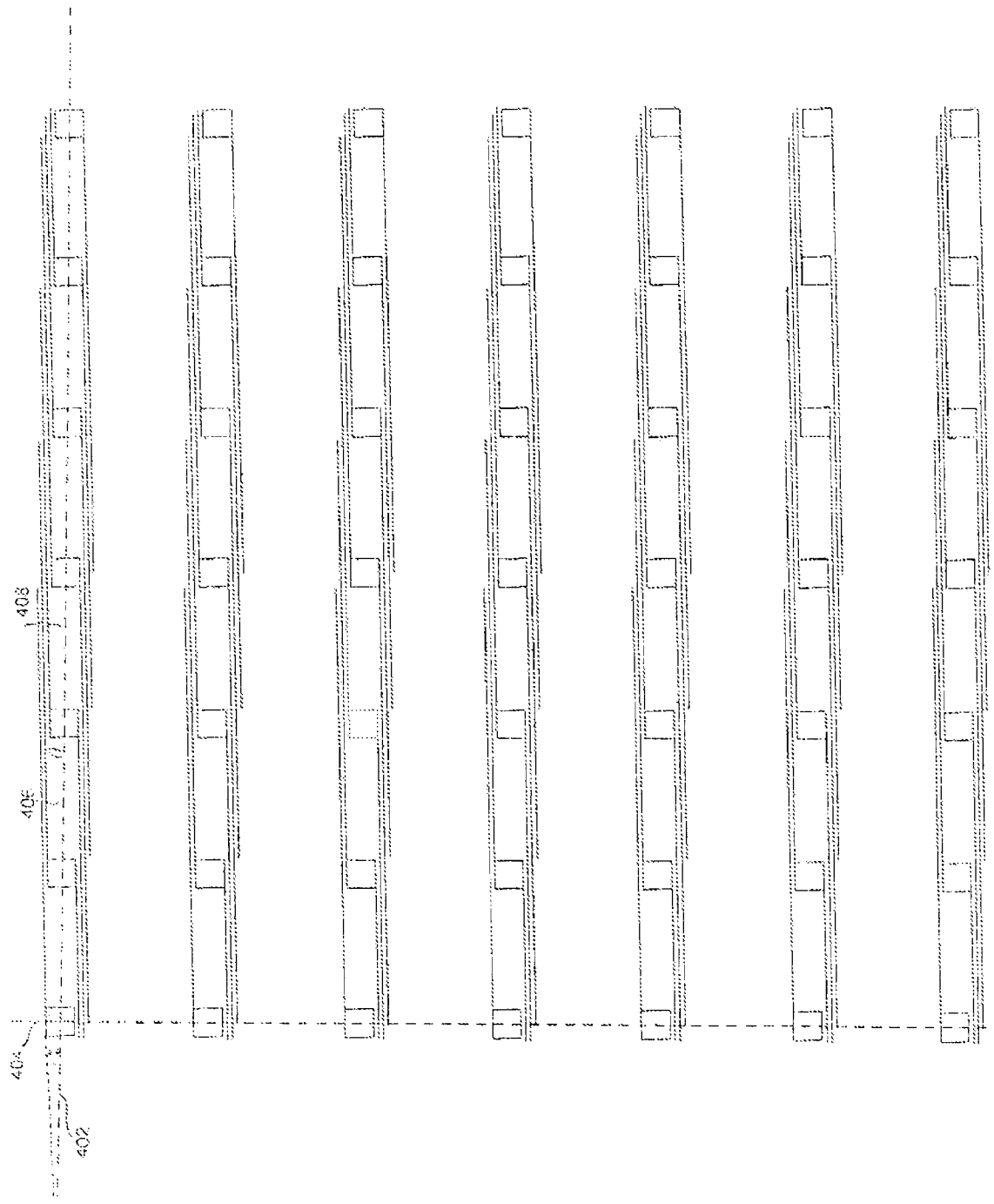

FIG. 4B shows the organization of pad-interconnected-nanowire units ("PINUs") within a small portion of a first sub-layer of the predominantly nanoscale layer of a two-layer nanoscale/macroscale-interface embodiment of the present invention. The PINUs are arranged so that the centers of the pads of the PINUs fall on linear columns and rows. In FIG. 4B, a horizontal dashed line 402 is drawn through the centers of pads in one row, and a vertical dashed line 404 is drawn through the centers of a column of pads. The PINUs, including both the pad-portion and nanowire-portions of each PINU, are rotated by a small angle θ (406 in FIG. 4B) with respect to the row direction. Rotation of the PINUs allows nanowires of the PINUs to form closely spaced nanowire bundles, such as closely spaced nanowire bundle 408 in FIG. 4B, oriented at the small angle θ with respect to the row direction. In the described embodiments of the two-layer nanoscale/macroscale interface, the rows and columns that define the center of the PINUs form a rectilinear grid with square cells, although, in alternative embodiments, the columns need not be perpendicular to the rows, and the cells may be rhomboid. In the described embodiments of the present invention, the centers of the pads of the first nanoscale sub-layer are positioned to directly overlie the centers of approximately one-half of the pins in the predominantly microscale layer of the two-layer nanoscale/microscale interface, with the remaining pins centered within each square nanoscale cell of the first nanoscale sub-layer.

Figure 4C:
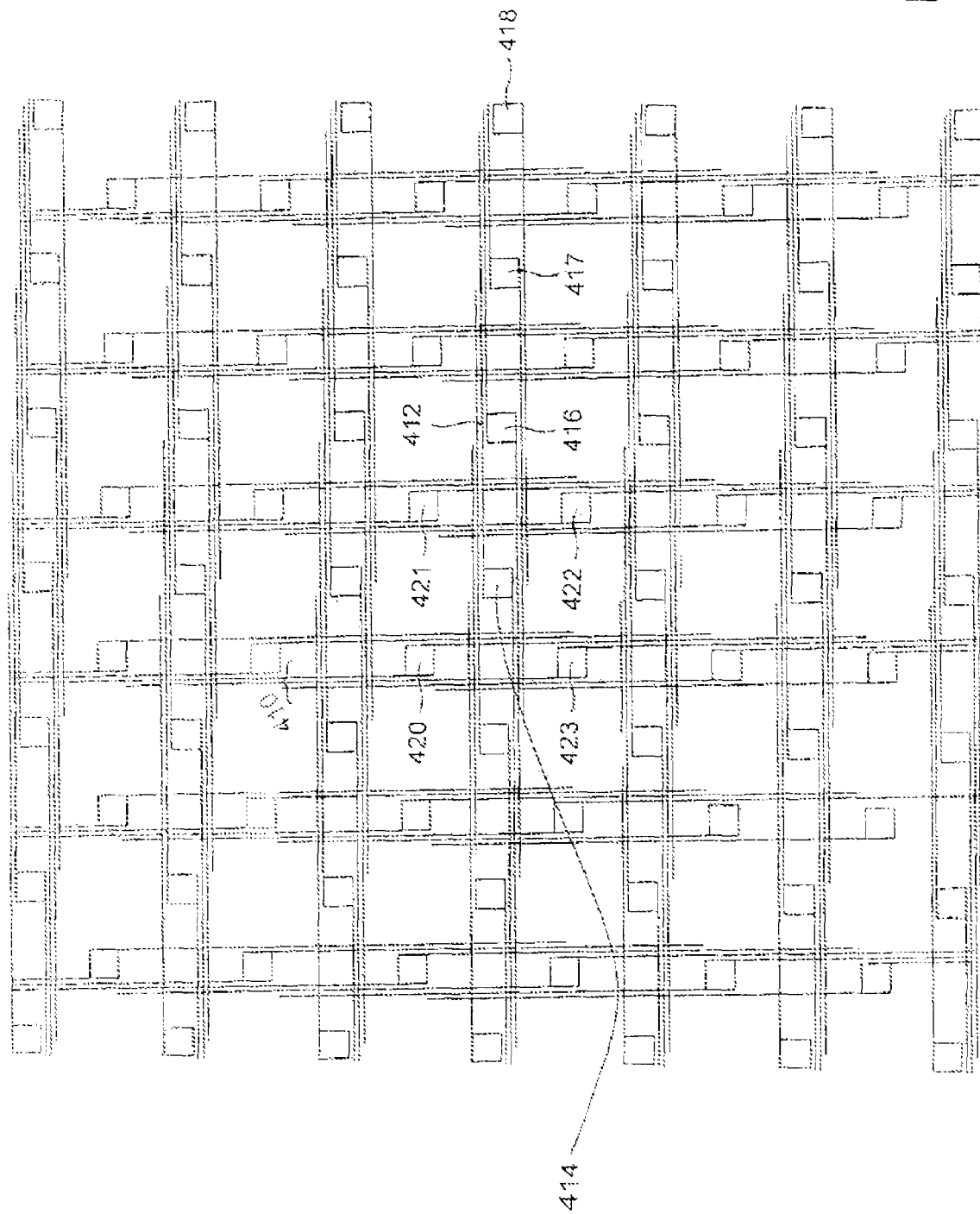

FIG. 4C shows a second nanoscale sub-layer overlaying the first nanoscale sub-layer shown in FIG. 4B to form a small portion of the tessellated, predominately nanoscale layer of a two-layer nanoscale/macroscale-interface embodiment of the present invention. In the described embodiments of the present invention, the second nanoscale sub-layer is identical in organization to the first nanoscale sub-layer, but is rotated 90 degrees with respect to the first nanoscale sub-layer and translated, by $1/\sqrt{2}$ times the pad-repeat distance along columns and rows of the first nanoscale sub-layer, in a diagonal direction, so that the pads of the second nanoscale sub-layer are located at the centers of the cells formed by the pads of the first nanoscale sub-layer and so that each second-sub-layer pad is, in the case of square cells, equidistant from the nearest surrounding pads of the first nanoscale sub-layer. In this organization, the nanowires of the second nanoscale sub-layer form parallel, closely spaced bundles, such as parallel, closely spaced bundle 410, perpendicular to the parallel, closely spaced bundles of nanowires of the first nanoscale sub-layer. In the predominantly nanoscale layer shown in FIG. 4C, each of the two nanowires of each PINU has a length equal to approximately three times the repeat distance of pads in the column and row directions of the nanoscale sub-layer that contains the PINU. For example, nanowire 412 emanating from pad 414 of the second nanoscale sub-layer spans pads 416-418 of the first nanoscale sub-layer, which have pad-repeat distances equal to those in the second nanoscale sub-layer. In alternative embodiments, the nanowires may have much greater lengths with respect to the pad repeat distance, as long as a nanowire in one layer is not positioned so closely to a pin or pad in the other layer that there is an undesired electrical interaction between the two. The longer the nanowires, the more nanowires that may be present in each parallel, closely spaced bundle of nanowires. Pad 414 is representative of the vast majority of pads within a large, predominantly nanoscale layer of the illustrated two-layer nanoscale/microscale interface, and is surrounded by two vertical and two horizontal channels, each comprising parallel, closely spaced bundles having a three-nanowire width, which separate pad 414 from its four nearest neighbor pads 420-423 in the first nanoscale sub-layer.

Figure 4D:
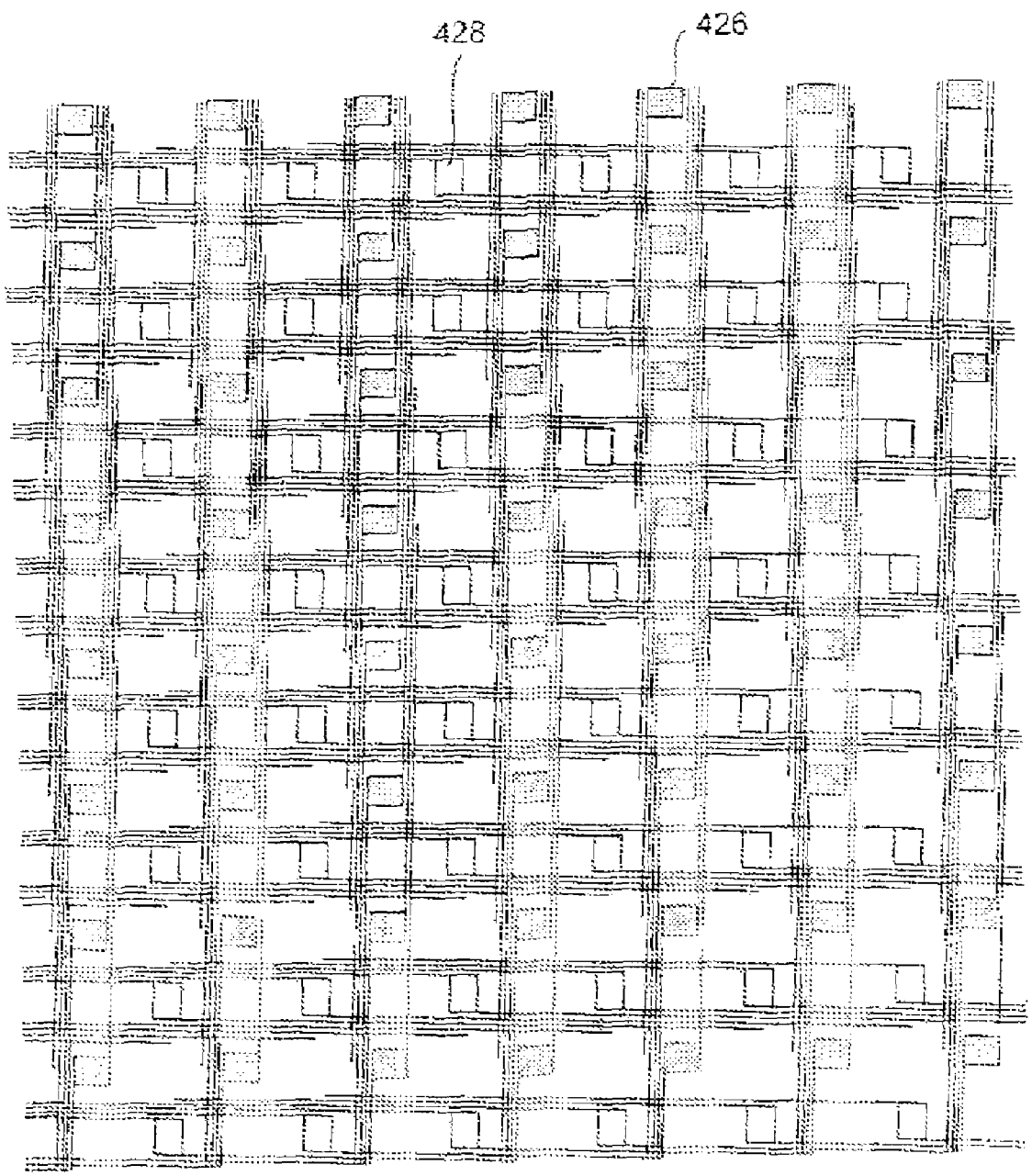

FIG. 4D illustrates, in a fashion similar to FIGS. 4B and 4C, a tessellated, predominantly nanoscale layer of a two-layer nanoscale/microscale-interface embodiment of the present invention in which each of the two nanowires of each PINU have a length equal to approximately four times the repeat distance of the pads within the nanoscale sub-layer that contains the PINU. While, in FIG. 4C, the parallel, closely spaced bundles of nanowires each includes, at each point, three separate nanowires, in the parallel, closely spaced bundles of nanowires in FIG. 4D each includes, at each point, up to four nanowires. Each channel is actually composed of many different nanowires, since channels span the entire, or a large portion of the, predominantly nanoscale layer, while individual nanowires are generally much shorter. Thus, the length of the nanowires of each PINU determine the width, in nanowires, of the parallel, closely spaced bundles of nanowires, or channels, within the tessellated, predominantly nanoscale layer. In FIG. 4D, the darkly colored pads, such as pad 426, lie in a first nanoscale sub-layer, and the lighter shaded pads, such as pad 428, lie in a second nanoscale sub-layer.

Figure 5:
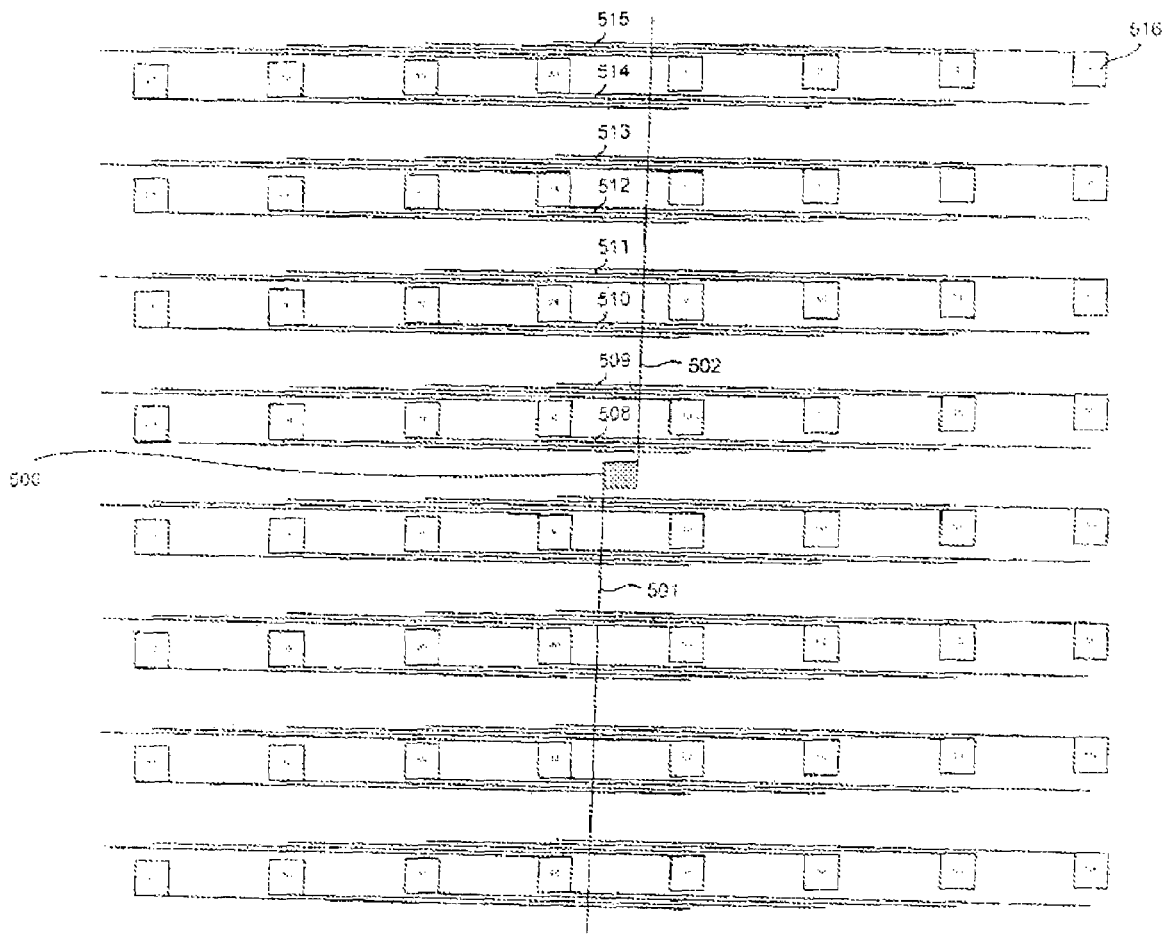
FIG. 5 illustrates the first-nanoscale-sub-layer pads electrically connected, through a single nanowire junction, to one particular second-nanoscale-sub-layer pad in the tessellated, predominantly nanoscale layer of a two-layer nanoscale/microscale interface-embodiment of the present invention shown in FIG. 4D.

FIG. 5 illustrates the first-nanoscale-sub-layer pads potentially electrically connected, through a single nanowire junction, to one particular second-nanoscale-sub-layer pad in the tessellated, predominantly nanoscale layer of a two-layer nanoscale/microscale interface-embodiment of the present invention shown in FIG. 4D. As discussed above, the nanowires 501 and 502 emanating from the particular second-nanoscale-sub-layer pad 506 each span four pad-repeat distances. Each of the two nanowires 501 and 502 therefore cross over, and form nanowire junctions, with the four nanowires in eight different channels. For example, nanowire 502 forms nanowire junctions with each of the four nanowires in channels 508-515. Each nanowire junction potentially connects, depending on the nature of the nanowire junction, the nanowire with a first-nanoscale-layer PINU. The particular second-nanoscale-sub-layer pad 506 may be electrically interconnected with the 64 first-nanoscale-level pads, such as first-nanoscale-sub-layer pad 516, shown in FIG. 5, and numbered 1-64. A single pin of the predominantly microscale or submicroscale layer of the two-layer nanoscale/microscale interface may therefore be connected, in the embodiment illustrated in FIG. 4D, to each of up to 64 neighboring pins by two PINUs and a single intervening nanowire junction. When the length of the nanowires increases, the number of nanowires in each channel increases, the number of channels spanned by a PINU increases, and the number of pads or pins interconnected through a single nanowire junction geometrically increases. For example, in a nanoscale layer of a nanoscale/microscale-interface embodiment of the present invention in which each nanowire of a PINU spans ten pad-repeat distances, a given pad or pin may be electrically interconnected, through single nanowire junctions, with up to 400 neighboring pins or pads.

Figure 6:
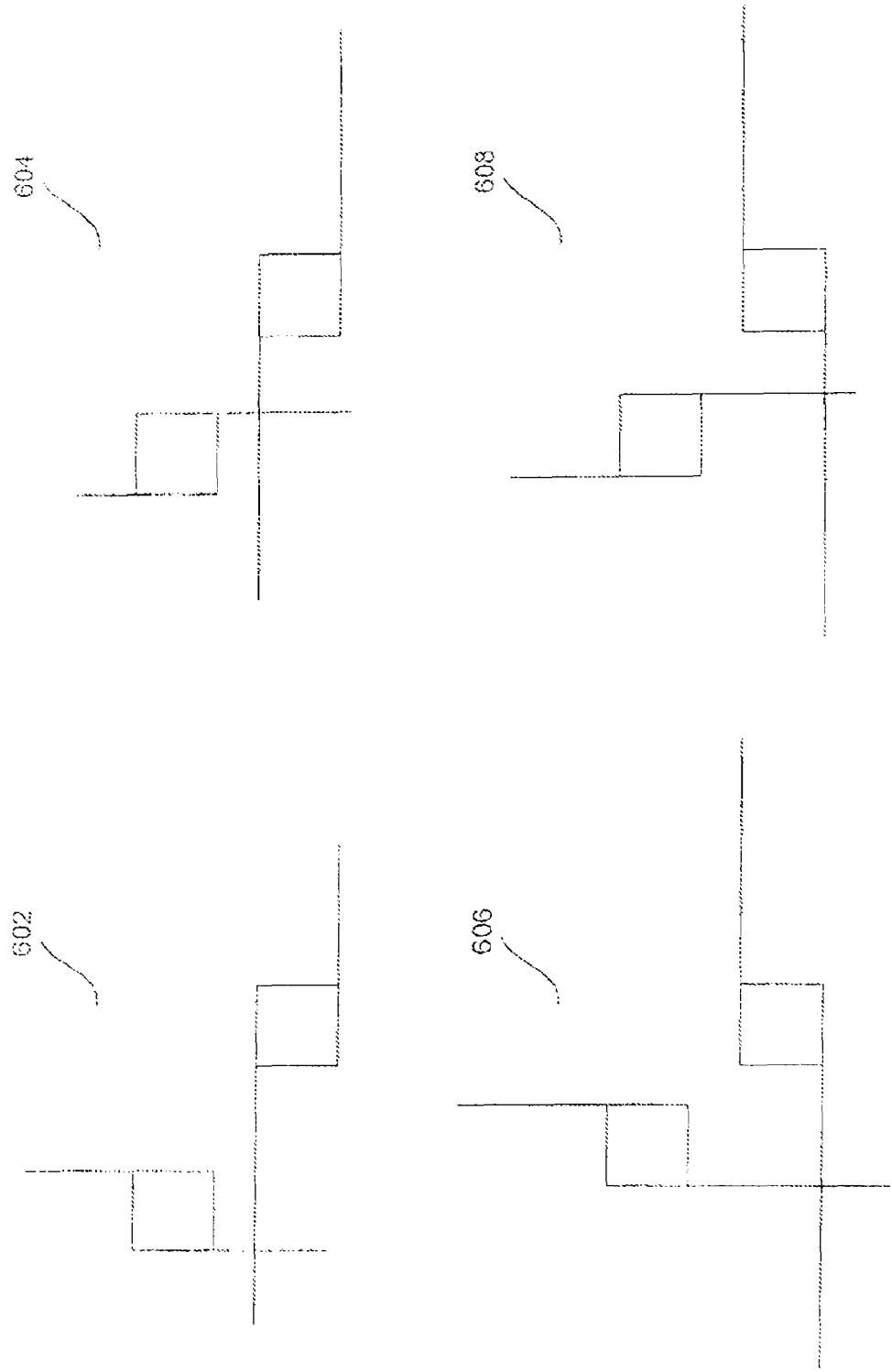
FIG. 6 illustrates four symmetry-related arrangements of a first-nanoscale-sub-layer pad with a second-nanoscale-sub-layer pad within a tessellated, predominantly nanoscale layer of a two-layer nanoscale/microscale-interface embodiment of the present invention.

There are an almost limitless number of different configurations of a tessellated, predominantly nanoscale layer that may be used in a two-layer nanoscale/microscale interface according to the present invention. As discussed above, pad-repeat distances may vary, angles between rows and columns of pads may depart from 90°, and pad-cornered cells of the tessellated, predominantly nanoscale layer may be, in addition to squares and rectangles, diamond shaped or rhomboid in nature. Furthermore, for any given arrangement of PINUs, there are a number of other symmetry-related arrangements with equivalent pad spacings and column and row orientations. FIG. 6 illustrates four symmetry-related arrangements 602, 604, 606, and 608 of a first-nanoscale-sub-layer pad and a second-nanoscale-sub-layer pad within a tessellated, predominantly nanoscale layer of a two-layer nanoscale/microscale-interface embodiment of the present invention. In three-dimensional networks of PINUs and other features and components within multiple nanoscale sub-layers, a much larger number of symmetry related arrangements for any given arrangement may be possible.

Figure 7A:
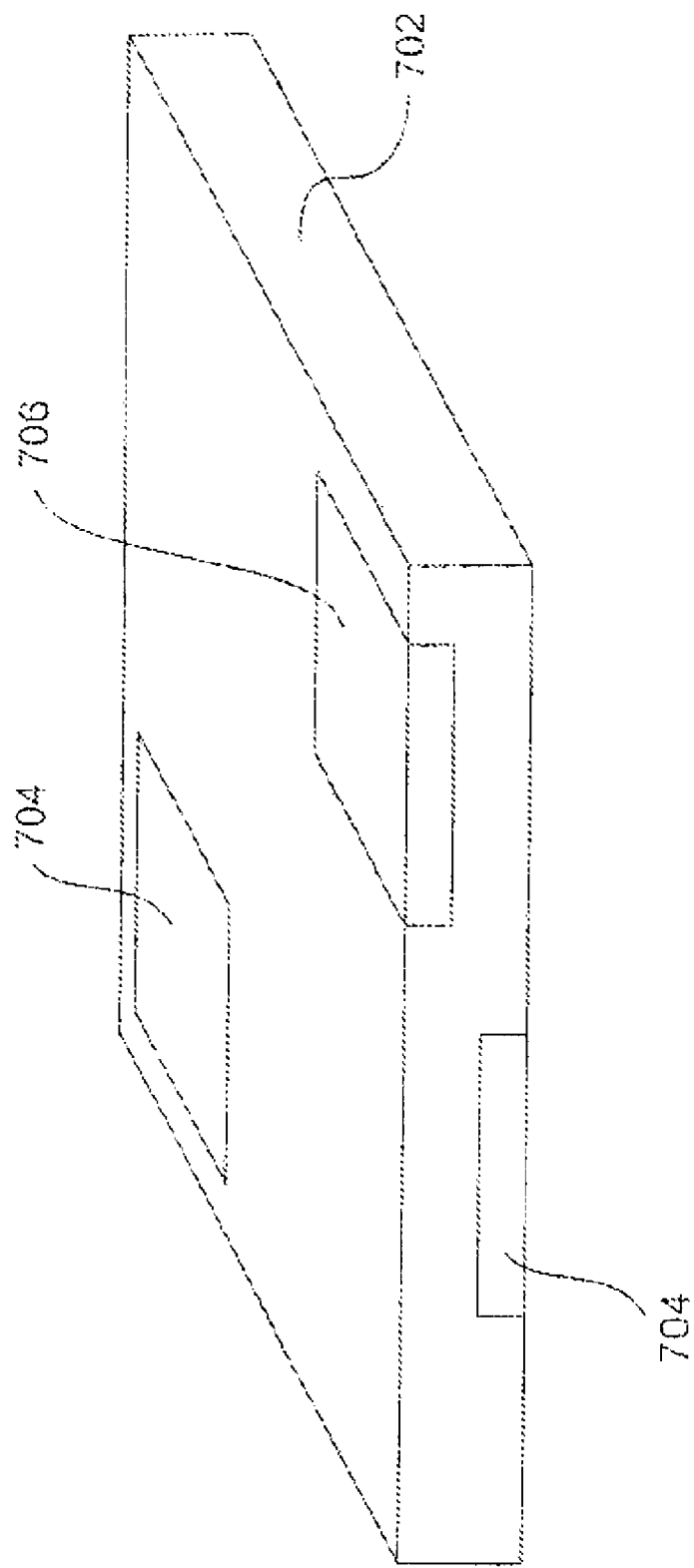
FIGS. 7A-T illustrate one method for fabricating a two-layer nanoscale/microscale-interface embodiment of the present invention, the method constituting an additional embodiment of the present invention.
Figure 7B:
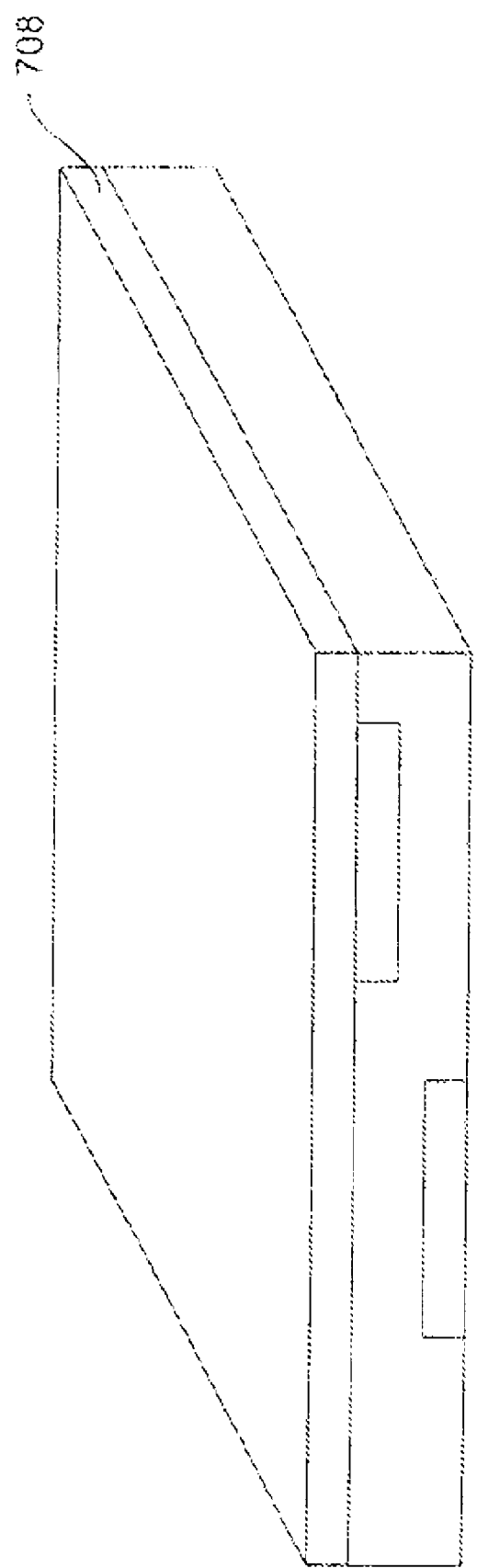
Figure 7C:
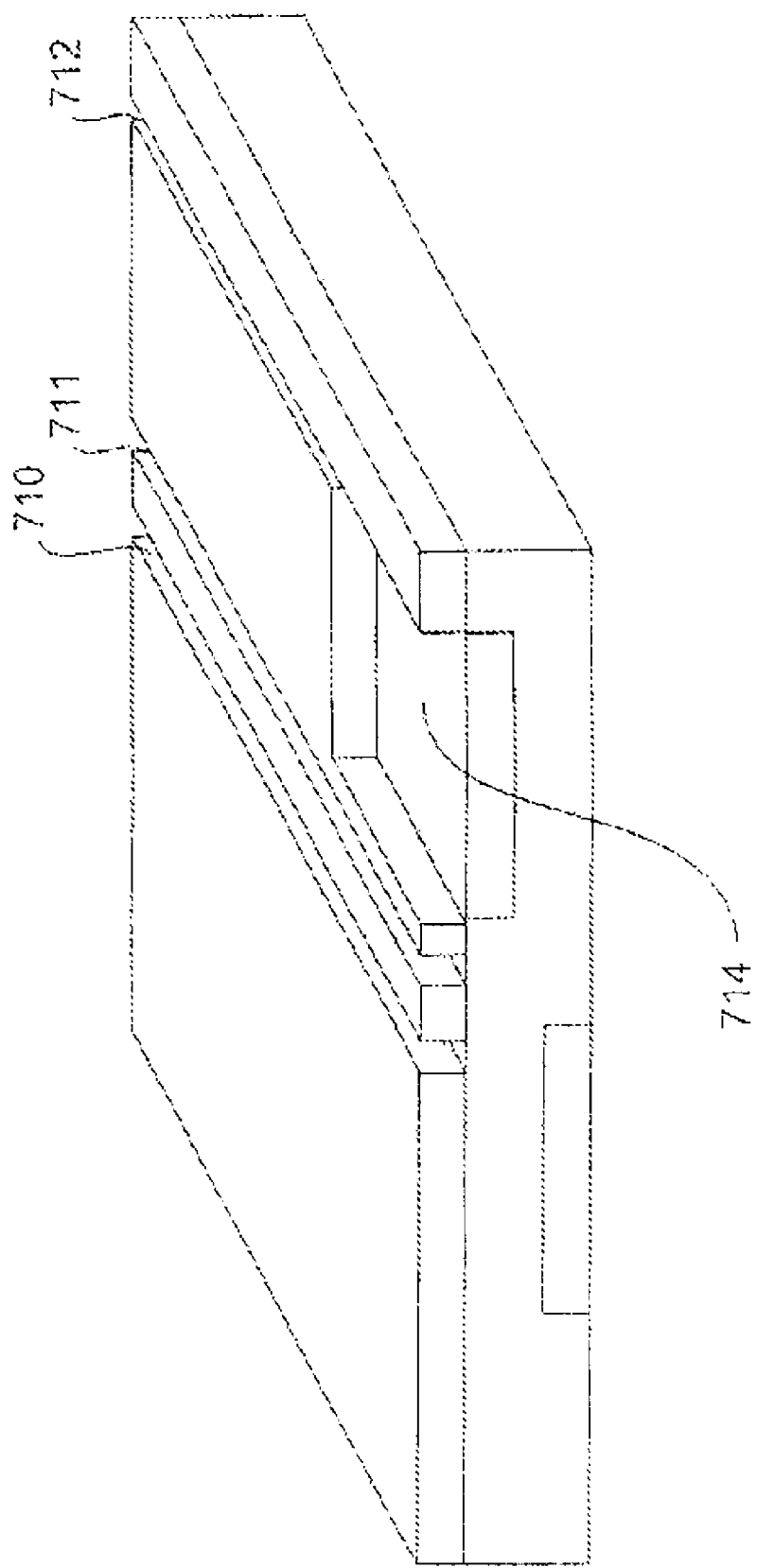
Figure 7D:
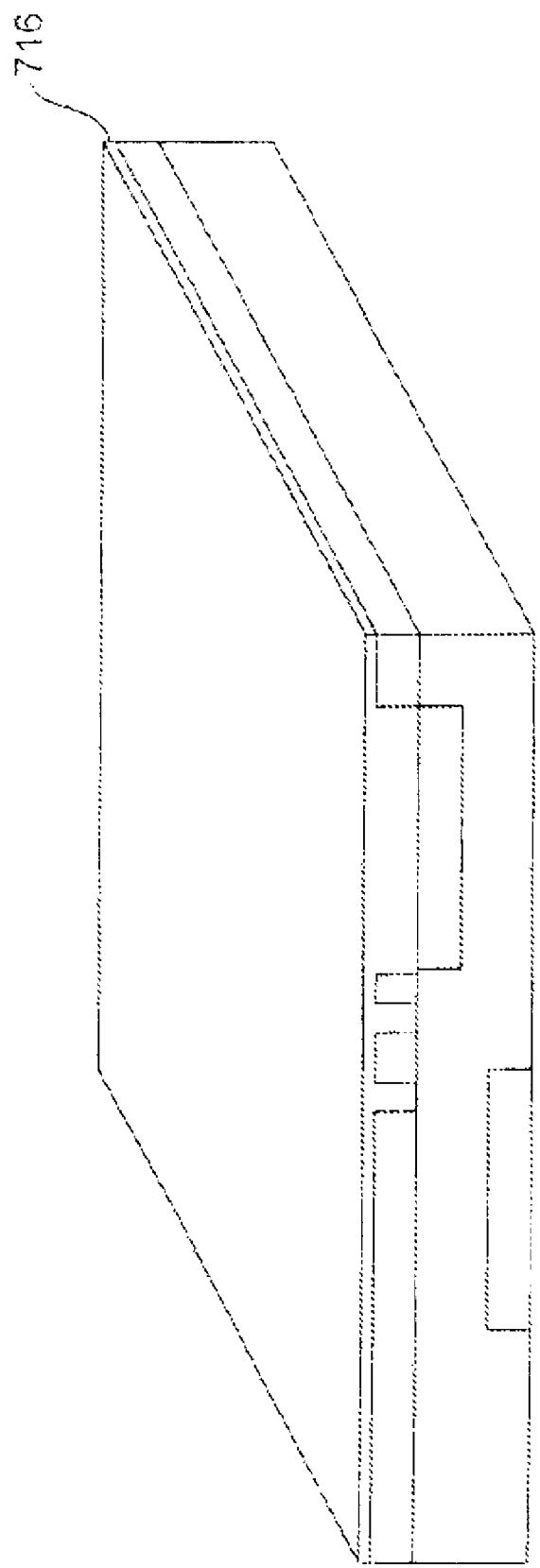
Figure 7E:
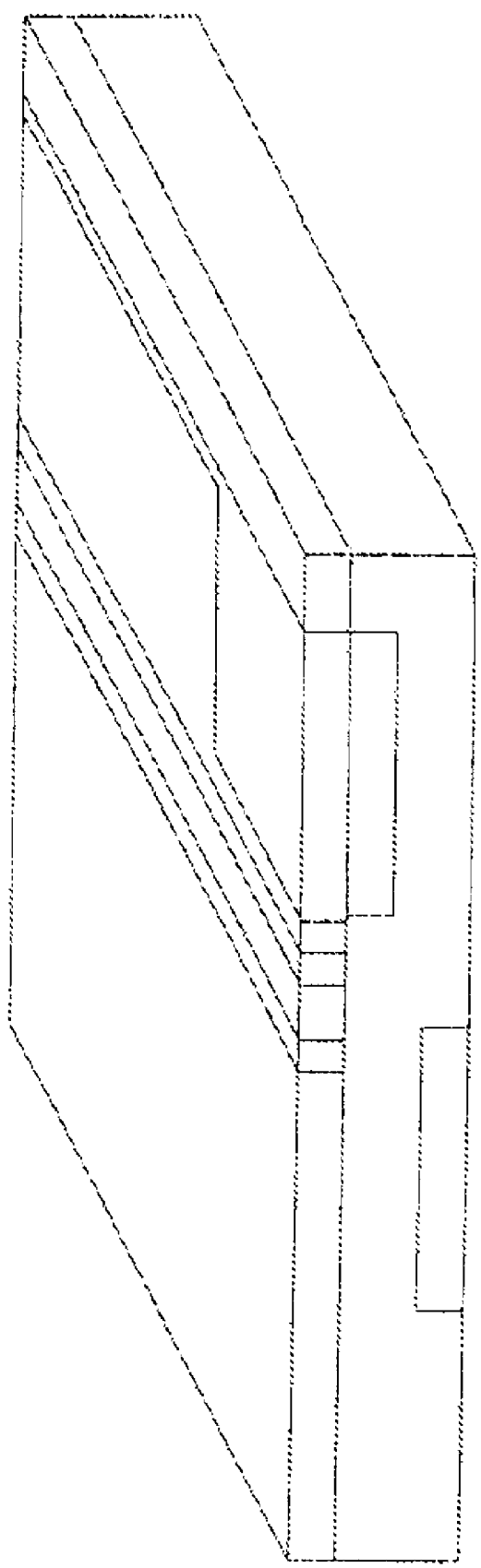
Figure 7F:
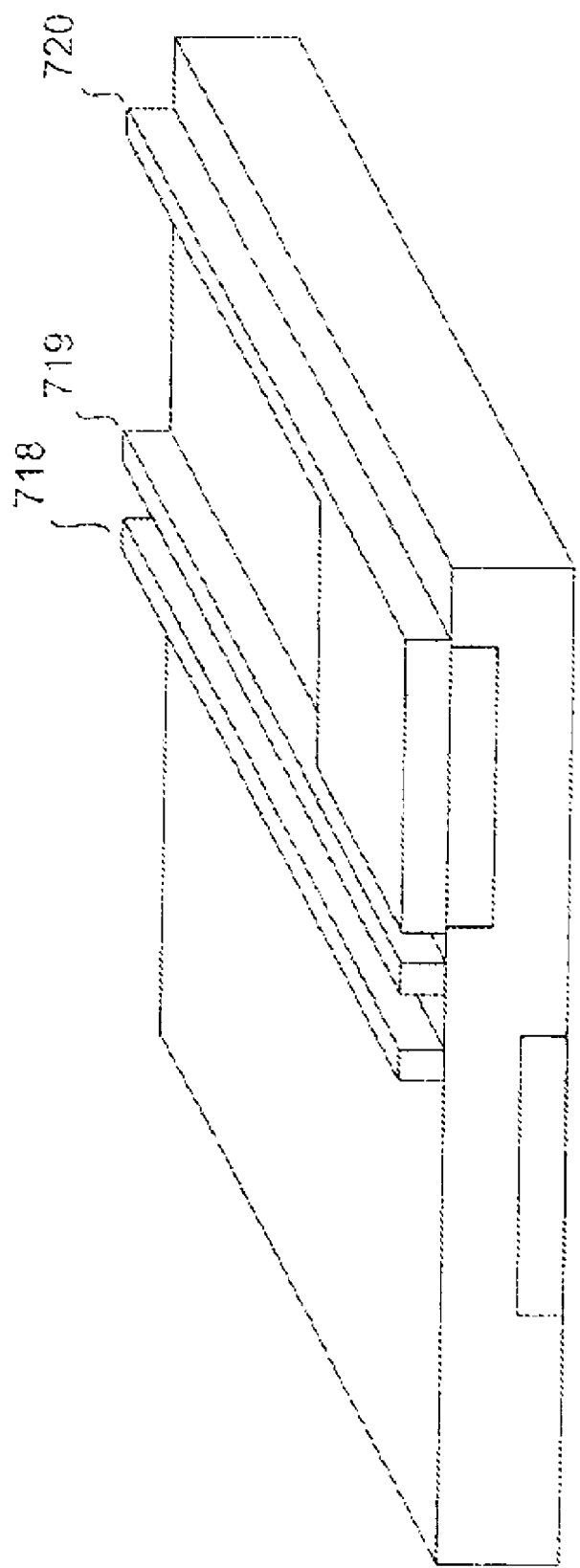
Figure 7G:
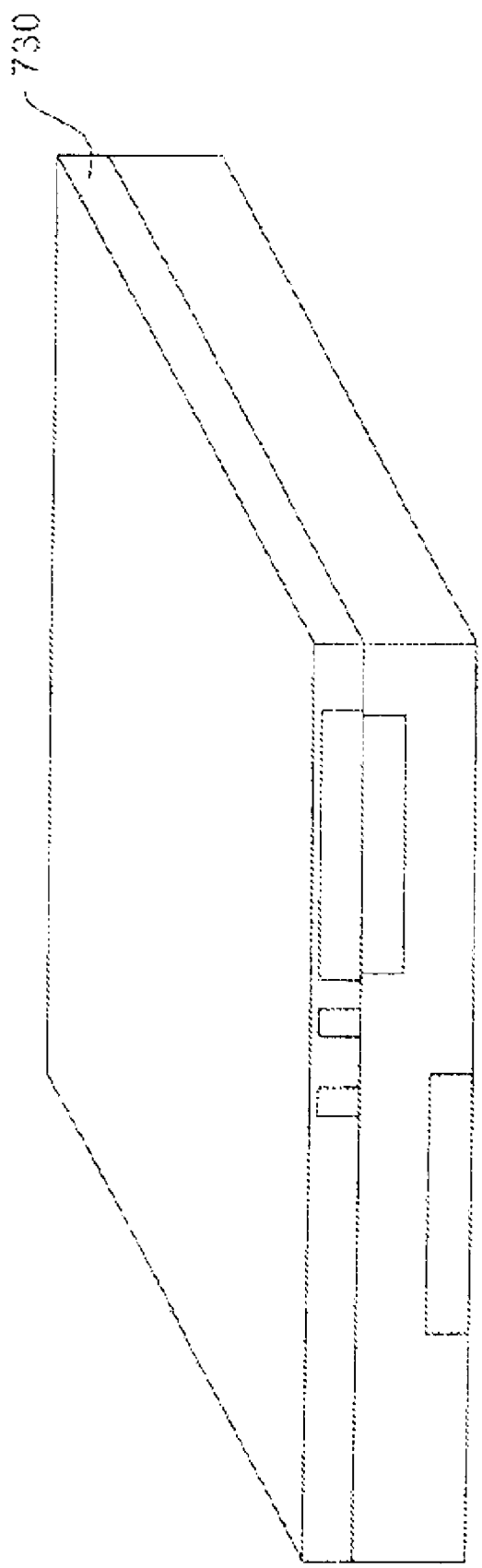
Figure 7H:
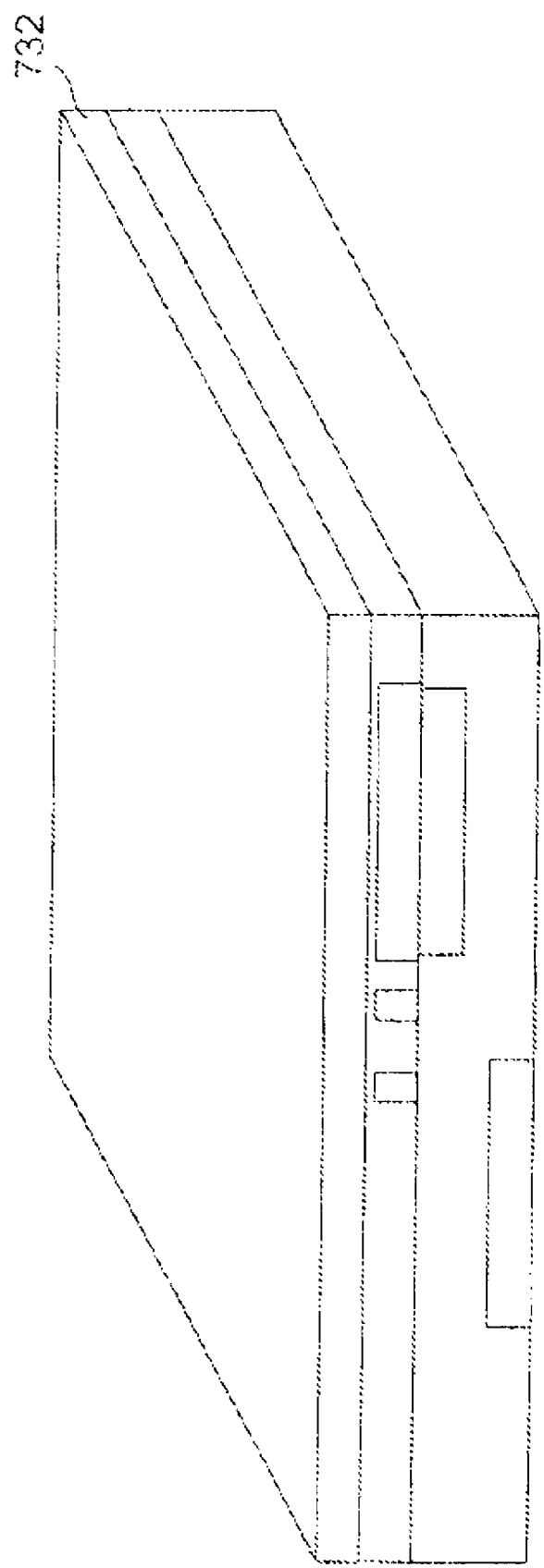
Figure 7J:
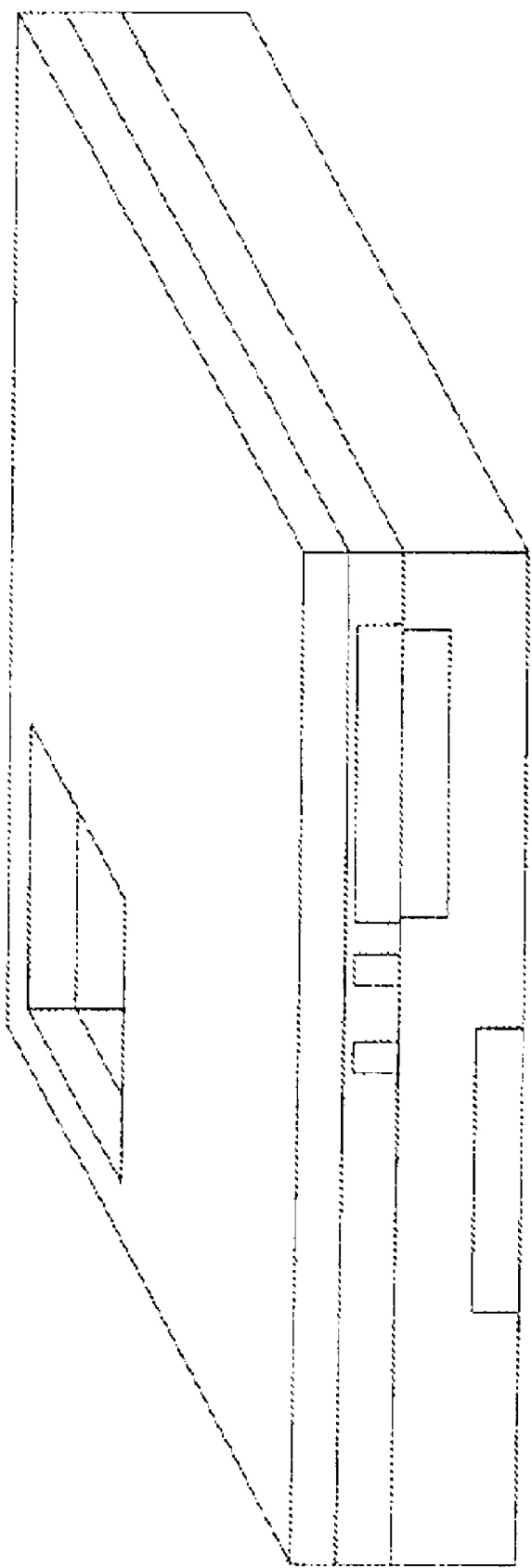
Figure 7L:
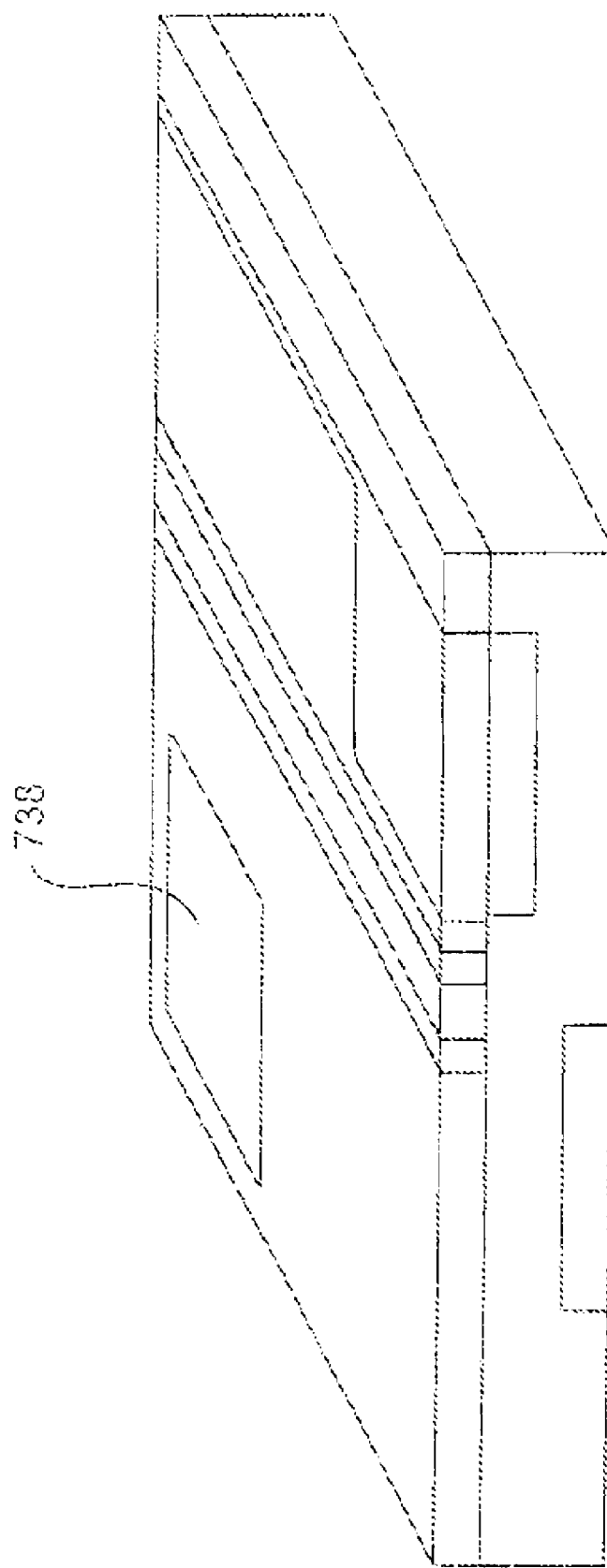
Figure 7M:
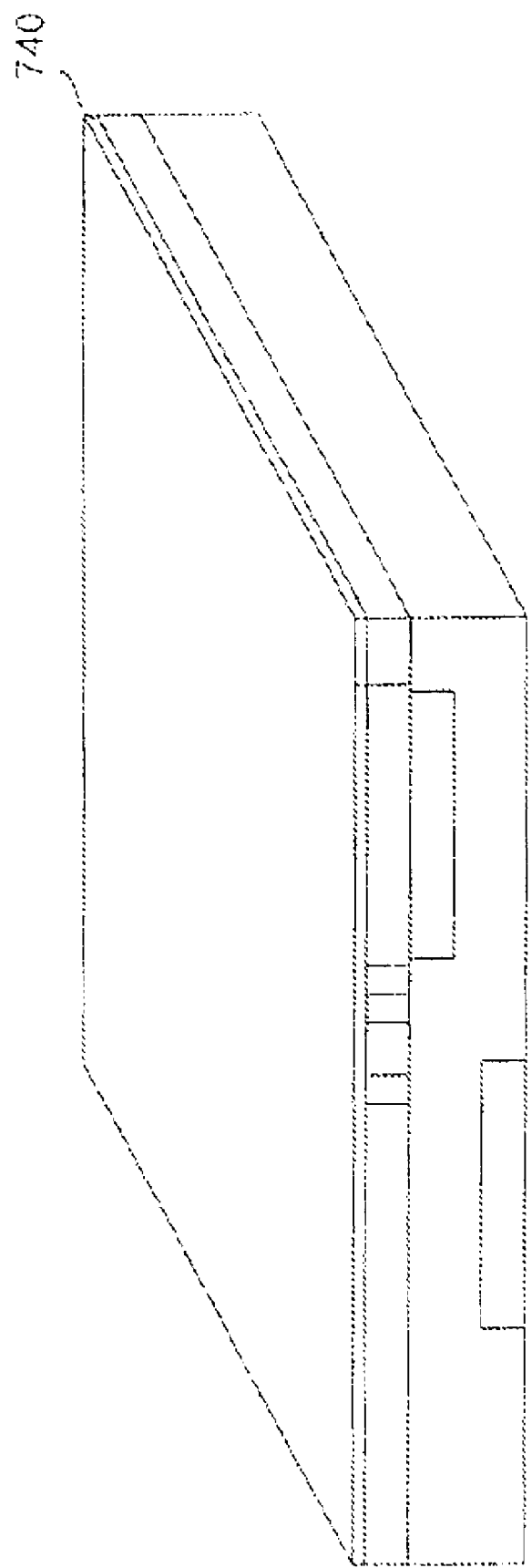
Figure 7N:
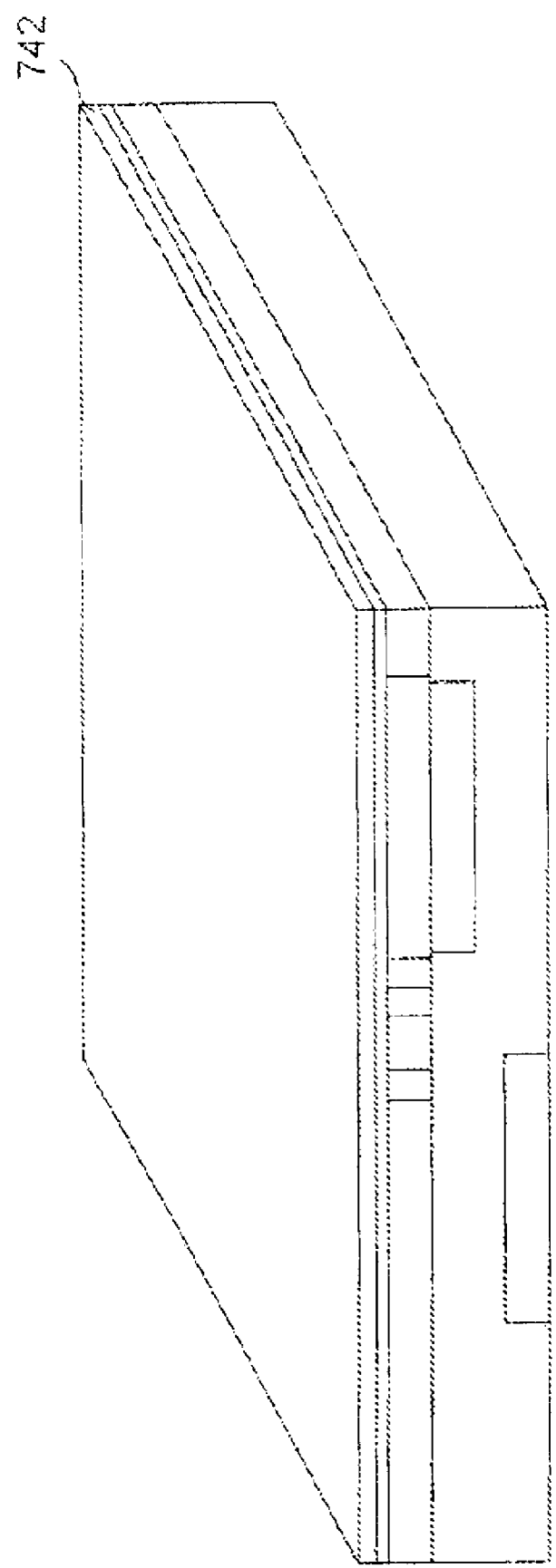
Figure 70:
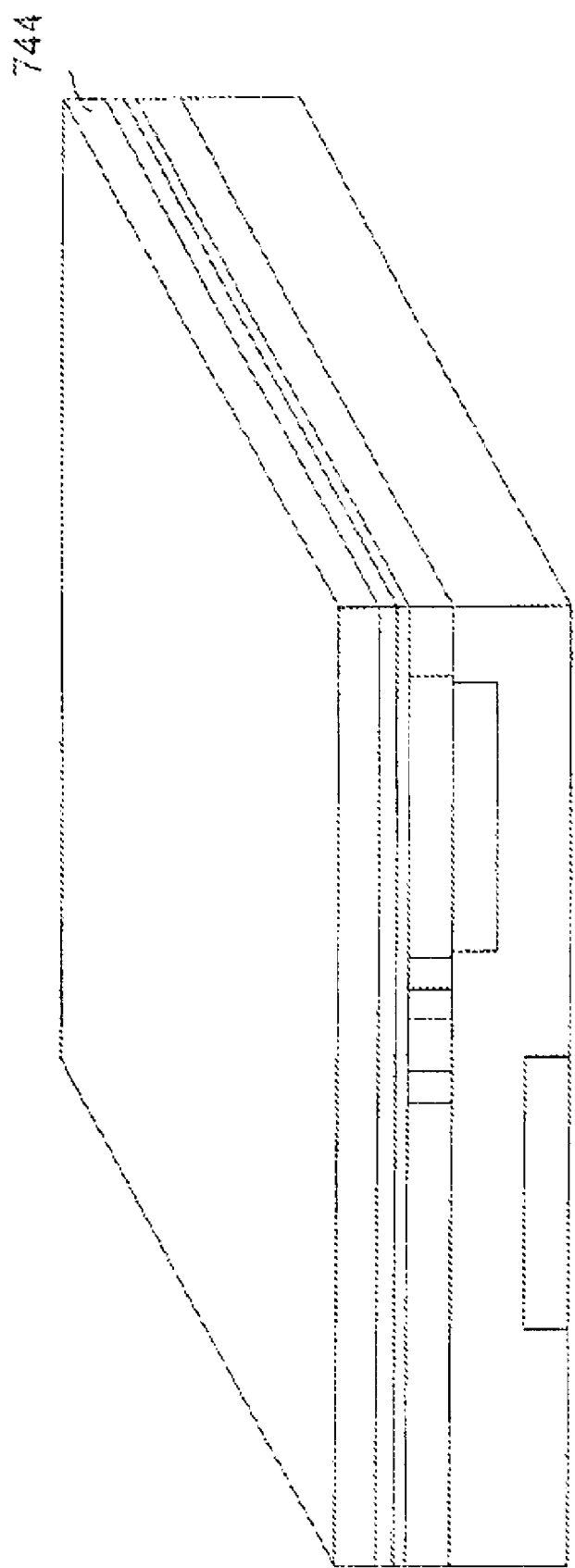
Figure 7P:
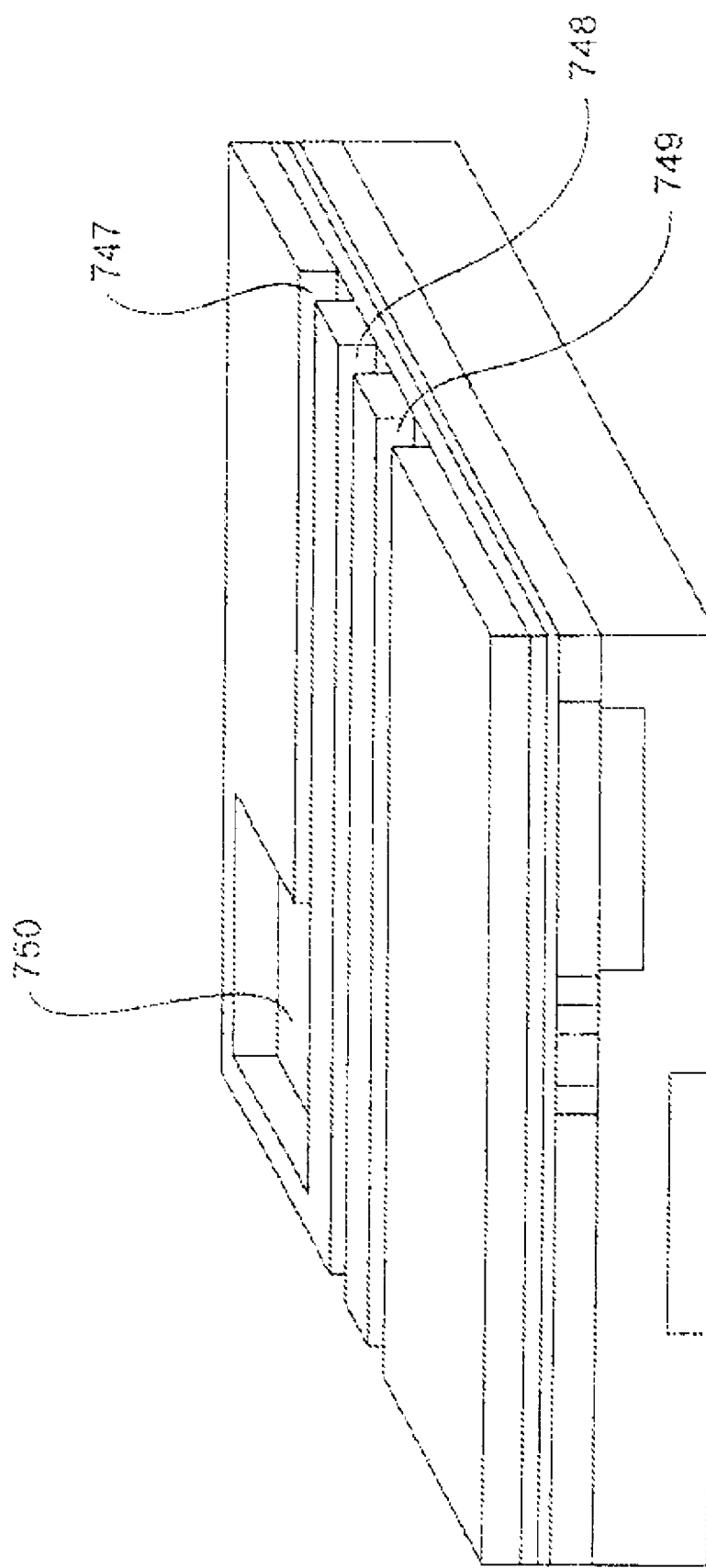
Figure 7Q:
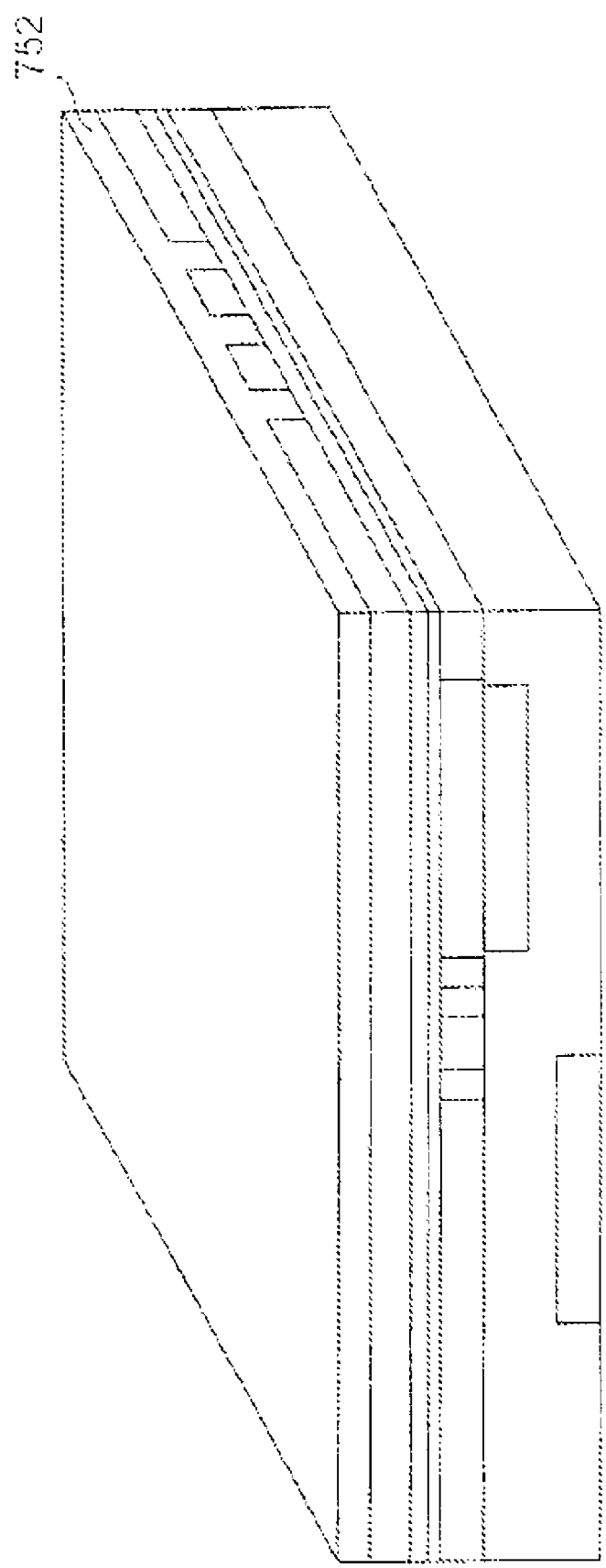
Figure 7R:
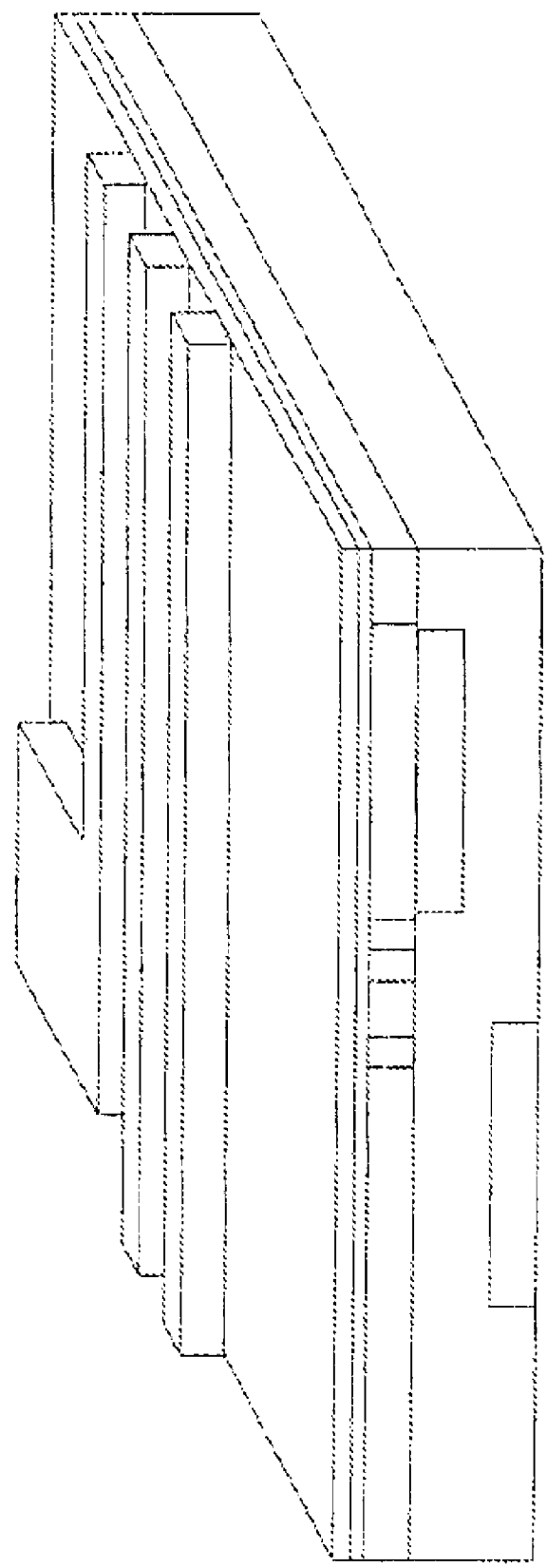
Figure 7S:
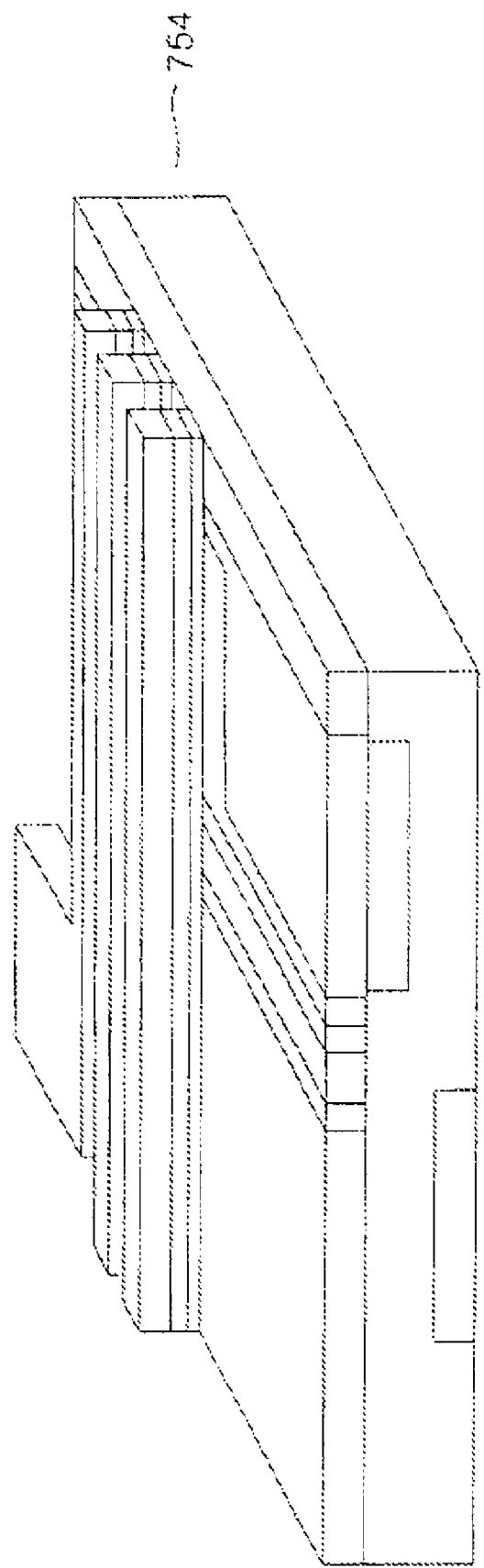
Figure 7T:
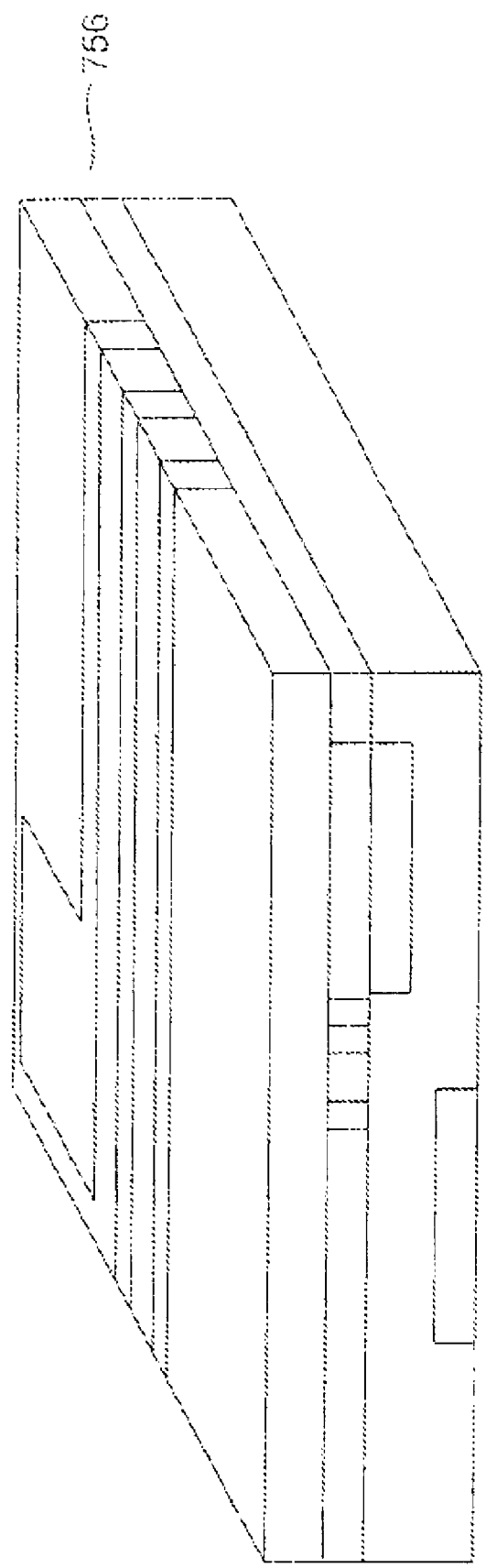

FIGS. 7A-T illustrate one method for fabricating a two-layer nanoscale/microscale-interface embodiment of the present invention, the method constituting an additional embodiment of the present invention. As shown in FIG. 7A, the process begins with a substrate consisting of, or including, a predominantly microscale layer 702 with a regular arrangement of microscale or submicroscale pins 704 and 706 at the surface of the substrate. The pins may be composed of a variety of conductive materials, including conductive polymers, metal elements or alloys, or conductive and doped silicon or gallium arsenide, and may be embedded in a variety of different substrate materials, including silicon dioxide. The predominantly microscale layer 702 includes further submicroscale or microscale components, signal lines, and other features 704 that implement various functional components and logic elements of an electronic device. The predominantly microscale layer is fabricated using conventional photolithographic methods.

Next, as shown in FIG. 7B, a layer of nanoimprint resist 708, such as solvated poly-methyl-methacrylate ("PMMA") or poly-benzyl-methacrylate ("PBMA") dissolved in benzyl-methacrylate, is deposited above the predominantly microscale layer. Then, as shown in FIG. 7C, the nanoimprint resist may be cured and then imprinted by a nanoimprinting technique to form troughs 710-712 and basins 714 corresponding to first-nanoscale-sub-layer nanowires and pads, respectively. Nanoimprinting techniques generally employ nanoimprinting stamps prepared from masters fabricated by painstaking, electron-beam-based techniques. The nanoimprinted nascent nanoscale/microscale interface may be briefly exposed to a nanoimprint-resist etchant to remove nanoimprint resist from the floors of the nanoimprinted troughs and basins.

Next, as shown in FIG. 7D, a conductive layer 716 is deposited above the nanoimprint resist to form first-nanoscale-sub-layer PINUs. In one embodiment of the present invention, platinum is used for PINUs. Unwanted portions of the deposited, conductive layer and underlying nanoimprint resist may be subsequently removed by a lift-off process to produce well-formed, conductive PINUs, as shown in FIG. 7F. Alternatively, a two-step process may be used to first remove unwanted conductive material, as shown in FIG. 7E, and to then remove nanoimprint resist. Any remaining nanoimprint resist may be removed by exposing the nascent two-layer nanoscale/microscale interface to a nanoimprint-resist etchant. At this point, the first-nanoscale-sub-layer PINUs 718-720 are fully fabricated.

Next as shown in FIG. 7G, a layer 730 of a dielectric material with a low dielectric constant k, such as $SiO_2$, is deposited over the first-nanoscale-sub-layer. This dielectric layer may be polished by a chemical/mechanical polishing step. Then, as shown in FIG. 7H, a nanoimprint resist layer 732 is applied. Then, as shown in FIG. 7I, basins 734 are imprinted, in a second nanoimprinting step, over microscale-layer pads that are not yet overlain with nanoscale PINU pads. As shown in FIG. 7J, an etching step may then be performed to etch through the $SiO_2$ layer to expose the microscale-layer pad underlying the nanoimprinted basins. As shown in FIG. 7K, a conductive layer 736 is next applied, and a liftoff process or two-step nanoimprint/conductive-layer removal process can then be used to produce a modified, first-nanoscale-sub-layer with conductive pillars, or vias 738, that rise up from the underlying microscale-layer pads to the surface of the modified, first-nanoscale-sub-layer.

As shown in FIG. 7M, nanowire-junction material 740 is next deposited on the surface of the nascent two-layer nanoscale/microscale interface. The nanowire-junction material may be, in certain embodiments, a variably resistive material that can reversibly transition between a relatively high conductivity state and a relatively low conductivity state upon application of two different voltages. Such material allows nanowire junctions to be configured electronically to either electrically interconnect the two nanowires that cross at the nanowire junction or to electrically isolate the two nanowires from one another. In alternative embodiments, alternative types of nanowire-junction materials may be deposited to produce alternative types of nanowire-junction components. In certain embodiments, multiple layers may be deposited in order to produce multi-layer nanowire junctions. Next, as shown in FIG. 7N, a thin layer of titanium 742 is deposited on the surface of the nascent two-layer nanoscale/microscale interface. Following deposition of the titanium, as shown in FIG. 7O, a second layer of nanoimprint resist 744 is deposited on the surface of the nascent two-layer nanoscale/microscale interface and cured.

In a third nanoimprinting step, as shown in FIG. 7P, the nanoimprint resist is stamped to produce troughs 747-749 and basins 750 in which second-nanoscale-layer nanowires and pads are subsequently formed. Then, as shown in FIG. 7Q, a second layer of conductive material 752 is deposited on the surface of the nascent two-layer nanoscale/microscale interface, the conductive material forming the PINUs of the second nanoscale sub-layer. In the described embodiment, platinum is again used for the second-sub-layer PINUs. Unwanted portions of the conductive layer and underlying nanoimprint resist are then removed by a second lift-off process, as shown in FIG. 7R, to produce a surface with exposed, second-nanoscale-level PINUs lying above a titanium coated surface. The nascent two-layer nanoscale/microscale interface can be etched to remove all non-PINU material down to the substrate surface, with nanowire-junction material and titanium remaining only below the second-nanoscale layer PINUs, where the nanowire-junction material and titanium layers are shielded from the etching process. This results in production of the two-layer nanoscale/microscale interface 754 shown in FIG. 7S. As shown in FIG. 7T, an additional $SiO_2$ layer may be applied, and polished, to produce a final two-layer nanoscale/microscale interface 756. The two-layer nanoscale/microscale interface may be additionally coated with protective layers or additional device layers, as needed for a particular application.

The process described above with respect to FIGS. 7A-T can be continued to form many additional layers, leading to a three-dimensional network of interconnection and active and passive nanoscale components spanning multiple nanoscale-sub-layers. The pad dimensions, nanowire dimensions, and other characteristics and parameters of the components and features of a given nanoscale sub-layer may be varied, as needed, to create the proper scale and density of interconnections for the given nanoscale sub-layer.

Figure 8:
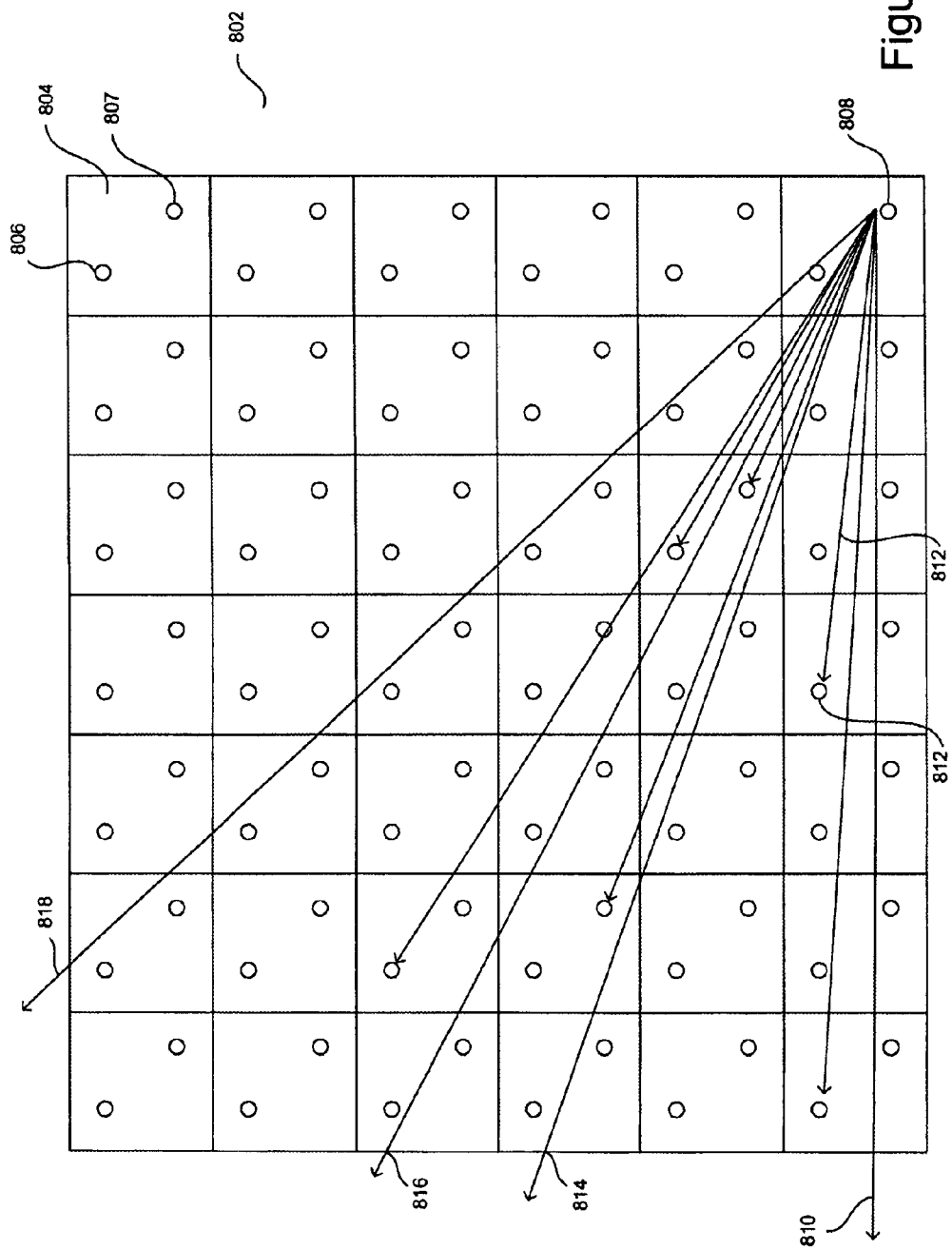
FIG. 8 shows a rectilinear grid of square microscale cells, each cell containing two different microscale pins.

A two-layer nanoscale/microscale interface of the present invention can be characterized by a number of different parameters. Moreover, various embodiments of the present invention can be optimized for particular applications by optimizing one or more of these parameters with respect to various different criteria. One characterizing parameter is the angle $\theta$ by which PINUs are rotated with respect to a linear row of pad centers within a nanoscale sub-layer. FIG. 8 shows a rectilinear grid 802 of square microscale cells, such as microscale cell 804, each cell containing two different microscale pins, such as microscale pins 806-807 in microscale cell 804. The rectilinear grid 802 in FIG. 8 represents the predominantly microscale layer of a two-layer nanoscale/microscale interface above which the tessellated, predominantly nanoscale layer is fabricated. Assuming that the pad of a first-nanoscale-level PINU is to be fabricated above pin 808, the angle $\theta$ may be chosen to optimize the two-layer nanoscale/microscale interface. The numerous arrows emanating from pin 808, such as arrow 810, in FIG. 8 represent a few of the many choices for the angle $\theta$ with respect to the direction of the rows of pins within the rectilinear grid 802. In general, it is desirable to have nanowires as long as possible, in order to allow for placement of as many nanowires as possible in each channel. Maximizing the number of nanowires per channel in turn maximizes the potential connectivity between pins implemented within the predominantly microscale layer. A characteristic parameter of the two-layer nanoscale/microscale interface is a minimum distance of separation between a nanowire and any microscale pin other than the microscale pin on which the pad of the PINU including the nanowire is centered.

The maximum possible lengths of the nanowires emanating from a PINU positioned over pin 808 vary with $\theta$. For example, in the direction represented by arrow 812, the nanowire would need to be relatively short, to avoid coming within a distance less than a minimum separation distance to any neighboring pin, such as neighboring pin 812. Approach of a nanowire to a neighboring microscale pin closer than a threshold minimum distance may result in a short within the predominantly nanoscale layer. In the rectilinear grid shown in FIG. 8, certain values of $\theta$ corresponding to the directions represented by arrows 810, 814, 816, and 818 are clearly more favorable than others, including those corresponding to the direction represented by arrow 812. The $\theta$ angles represented by arrows 810 and 818 correspond to the most favorable directions. In order to fabricate PINUs with longest-possible nanowires, one may seek to minimize the angle $\theta$ in order to, as closely as possible, align nanowires with the horizontal rows of pins, as represented by direction 810 in FIG. 8. In alternative embodiments of the present invention, the angle $\theta$ may be selected to be as close as possible to the direction indicated by arrow 818 in FIG. 8.

In the described embodiments of the present invention, each PINU has equal-length nanowires. Equal length nanowires are not required, but may be desirable for minimizing reactive-capacitance delays within the predominantly nanoscale layer for a particular degree of pin interconnection. The greater symmetry provided by equal-length nanowires may, in many applications, also facilitate routing of signals between microscale pins.

Another characteristic parameter for two-layer nanoscale/microscale interfaces of the present invention is the dimensions of PINU pads. In general, when the area of the pads is relatively small, a greater fraction of the area of the nanoscale layer can be devoted to nanowires and nanowire interconnections. Additional parameters include a minimal distance of separation between nanowires, the width of nanowires, dimensions of the microscale-layer pins, dimensions of the repeating units, or cells, that define the interface between the microscale and nanoscale layers, a minimum distance of separation between nanowires and pins, and parameters that characterize uncertainties and errors in alignment of the nanoscale layer to the microscale layer and in the positioning of features within each layer. All of these parameters affect the ultimate density of interconnection that can be achieved in various nanoscale/microscale-interface embodiments of the present invention. Certain of these parameters, such as the minimum separation distances between nanowires and between nanowires and pins and the nanowire widths may depend on the materials from which the nanoscale/microscale-interface embodiments of the present invention are fabricated, on the types of logic and interconnections implemented in the nanoscale layer, on the operational voltage and current levels within the nanoscale/microscale-interface embodiments, on the processes used to fabricate the nanoscale/microscale-interface embodiments of the present invention, and other such conditions, characteristics, and constraints. These various parameters can be analyzed and adjusted in order to find optimal dimensions, special organizations, and operational characteristics for particular applications of various different nanoscale/microscale-interface embodiments of the present invention.

Many different types of nanowire junctions can be fabricated within the nanoscale layer of a nanoscale/microscale interface. Bistable junctions can be used as conventional switches. It is also possible to fabricate nanowire junctions that behave as diodes, transistors, variable resistors, and that exhibit even more exotic behaviors and characteristics without analogs in microscale devices. Such a diverse palette of components types allows for implementation of digital and analog logic in the nanoscale layer, as well as self-modifying tuning and defect-compensating functionality that provides the nanoscale/microscale interface with an ability to be configured following manufacture and to configure itself, over time, to optimize performance and to compensate for defects. A circuit with sufficient built-in logic may monitor its performance and correctness of operation in order to work around defects that inevitably arise over time due to environmental and operational hazards, such as cosmic rays, material degradation, static charges, and transient voltage pulses.

As one example, variable-resistor-like nanowire junctions can be used to trim an integrated circuit. Resistance values for various variable-resistor nanowire junctions can be selected, for example, to adjust internal voltages to compensate for variances in other components and features of a circuit above tolerance thresholds that would otherwise cause the circuit to exhibit undesired behavior and characteristics or to completely fail. For example, a defective switch may transition from one state to another between 3 and 4 volts, instead of between 0 volts and 2 volts, resulting in the switch being stuck in only one state despite input voltages that vary between 0V and 2V, to which the defective switch was designed to respond. By trimming an upstream variable-resistance nanowire junction to a lower resistance value, the input voltages to the switch may be adjusted from between 0V and 2V to between 3V and 4V, so that the switch is appropriately responsive to the input voltages.

As further examples, configurable nanowire junctions may be used to shunt signals from a defective logic module to a redundant, equivalent module or to a newly configured, replacement module, in order to isolate the defective module. Test or monitor logic within an integrated circuit may, using spare cycles and resource, periodically or continuously monitor an integrated circuit to detect and compensate for defective or functionally deteriorating components and features, and to configure replacement components and features.

While monitor and repair of an integrated circuit, either as a result of internal testing and monitoring logic, or as a result of external testing and monitoring components, including human technician, can increase manufacturing yields and extend the useful lifetimes of integrated circuits, optimization logic within a mixed-scale-interface embodiment of the present invention may lead to more highly customized and operationally efficient integrated circuits, tuned to specific applications, than could be economically designed and manufactured by volume manufacturing processes. Over time, an integrated circuit may recognize and optimize operational patterns and heavily used functionality by reconfiguring itself to more efficiently carry out often repeated tasks, much like particular software routines may be specifically optimized and tuned beyond initial encoding produced by compilers from high-level languages. Furthermore, the electronic devices within which integrated circuits are used may themselves contain defects, or develop defects or degrade, over time, and a mixed-scale-interface embodiment of the present invention may reconfigure itself to compensate for such external defects and inefficiencies, either as a result of feedback provided by external testing and monitoring functionality, or by application-specific monitoring and testing logic configured into the mixed-scale interface in a post-manufacturing configuration process. Nanoscale layers of a mixed-scale interface provide for sufficient redundancy of interconnection and components, as well as stable, but reconfigurable components and features, to allow for effective and comprehensive post-manufacturing tuning, adjustment, and reconfiguration needed for self-modifying defect-compensating and optimization functionalities that can significantly improve manufacturing yields, application-specific customization, and useful lifetimes of integrated circuits.

In the above discussion, the nanoscale/microscale interface is described as having a rectilinear architecture. For example, FIG. 8 shows a rectilinear grid that defines a matrix of square microscale cells, each cell containing two different microscale pins, and FIGS. 4A-D illustrate construction of a two-layer nanoscale/microscale interface above the microscale interface defined by the rectilinear grid shown in FIG. 8. However, the present invention is more generally directed to construction of nanoscale/microscale interfaces above microscale substrates according to any arbitrary tiling.

Figure 9A:
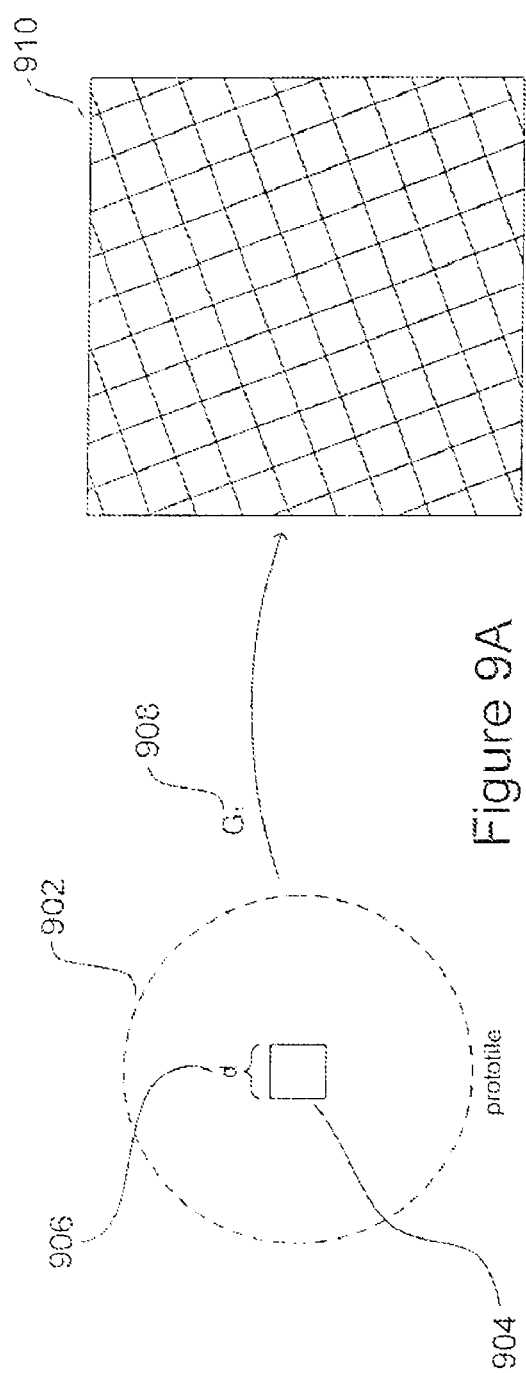
FIGS. 9A-B illustrate generation of two different types of monohedral tiling from small sets of prototiles.
Figure 9B:
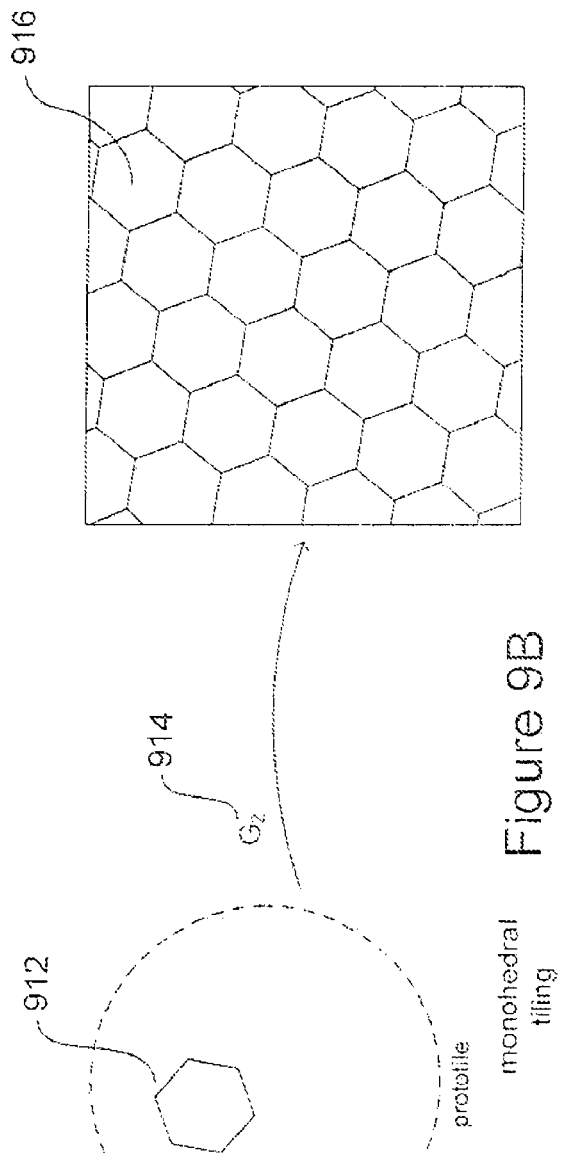

FIGS. 9A-B illustrate generation of two different types of monohedral tiling from small sets of prototiles. For example, in FIG. 9A, the set of prototiles 902 includes a single prototile 904 that has a square shape and a single edge dimension d 906. A tiling is an organization of prototiles, each selected from a generating set of prototiles 902, specified by a tiling-generation function $G_1$ 908, that entirely covers a surface, such as the surface 910 represented in FIG. 9A by a large rectangle. Tiles are not allowed to overlap, and must fit together so that, following the tiling, no portion of the underlying surface is exposed or, in other words, not covered by an overlying tile. Tilings generated by prototile-sets containing a single prototile are called monohedral tilings. FIG. 9B illustrates a second monohedral tiling, in which a single hexagonal prototile 912 is organized by the tiling function $G_2$ 914 to produce a hexagonal tiling 916 of a surface.

Figure 10A:
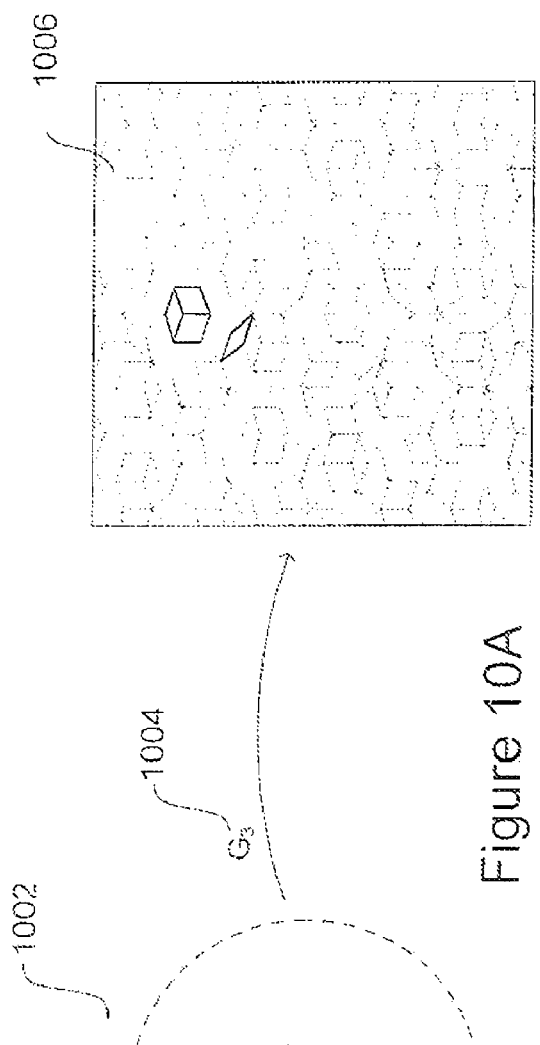
FIGS. 10A-B illustrate dihedral tilings.
Figure 10B:
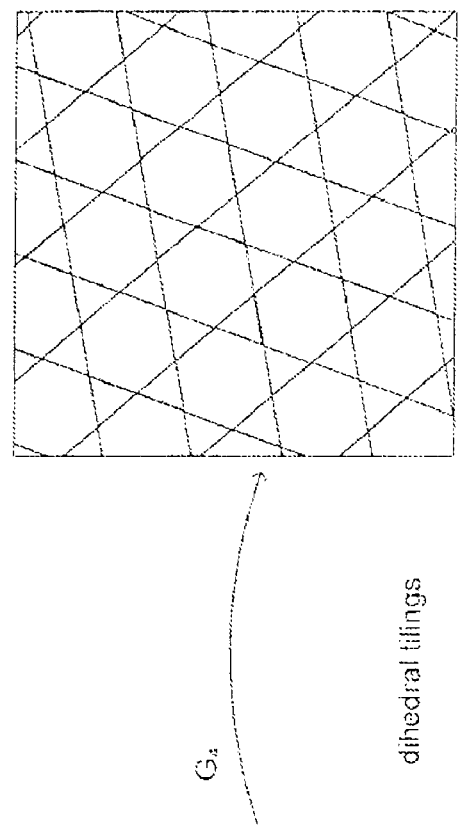

FIGS. 10A-B illustrate dihedral tilings. A dihedral tiling is generated from a prototile set containing two prototiles. In FIG. 10A, prototiles selected from the two-prototile set 1002 are selected and organized by the tiling function $G_3$ 1004 to produce a dihedral tiling 1006 of a surface. This tiling is particularly interesting, being an example of a Penrose tiling. Penrose tilings are aperiodic. However, the Penrose tiling has significant symmetry, including five-fold rotation axes and mirror planes. FIG. 10B illustrates a second dihedral tiling.

The tiling-generation functions may be expressed in many different ways. In general, a tiling-generation function comprises a small set of rules for sequentially selecting and positioning prototiles in order to produce a particular tiling. As discussed below, symmetries of many tilings are mathematically described as combinations of small sets of symmetry elements, and this concise mathematical description allows for a correspondingly small set of rules, or steps, to define the tiling process.

Figure 11:
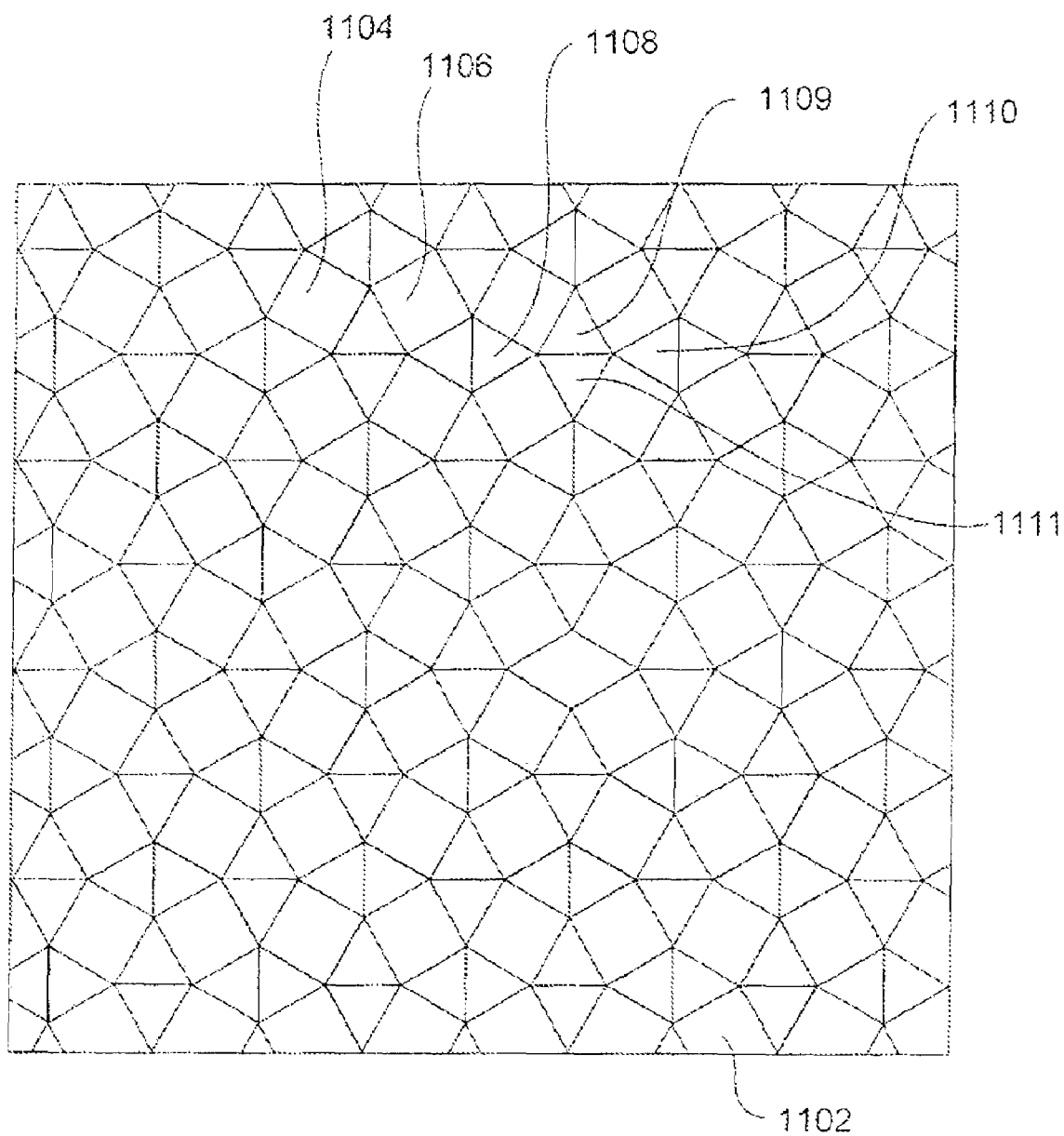
FIG. 11 illustrates a particular type of tiling, referred to as a "snub square tiling."

There are an infinite number of possible tilings of surfaces. However, tilings can be characterized mathematically in order to partition the infinite set of tilings into various categories, to facilitate generation and analysis of different types of tilings for different purposes. FIG. 11 illustrates a particular type of tiling, referred to as a "snub square tiling." Initially, observation of the tiling 1102 reveals a somewhat complex pattern, but also reveals immediately perceptible symmetry. The tiling includes square tiles in two different orientations 1104 and 1106, and triangular tiles in four different orientations 1108-1111. The snub square tiling is an example of a periodic tiling. Periodic tilings are most useful for design of nanoscale/microscale interfaces, because periodic tilings can be generated by repeating a fundamental unit, as discussed below, in two directions. Periodic tilings also generate equivalent points at regular intervals in known directions, allowing for sets of equivalent points, such as pin positions, to be easily described by coordinates of a coordinate system defined by two non-parallel axes, and to be easily mechanically or electrically addressed.

Figure 12:
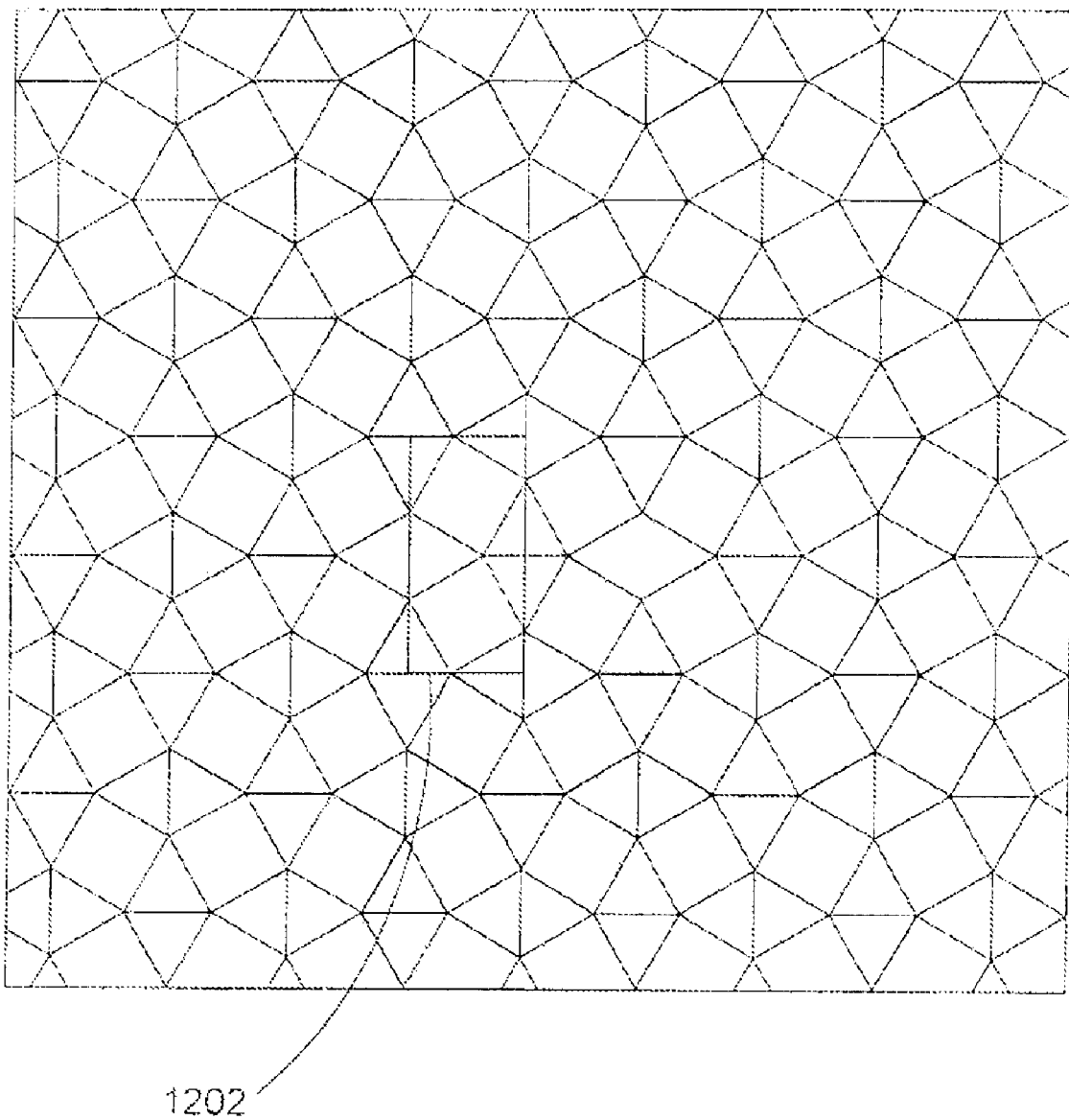
FIG. 12 illustrates a fundamental unit.

Examination of a periodic tiling reveals that one can select a very small portion of the area of the tiling that contains a minimum subset of the different types of tiles in their respective orientations. FIG. 12 illustrates a fundamental unit. As shown in FIG. 12, the shaded rectangular region 1202 includes two square tiles in the two different orientations, one entire triangle, and pieces of three additional triangles that can be reoriented and brought together to form three additional triangular tiles, the four triangles having the four different triangular-tile orientations discussed with reference to FIG. 11.

Figure 13:
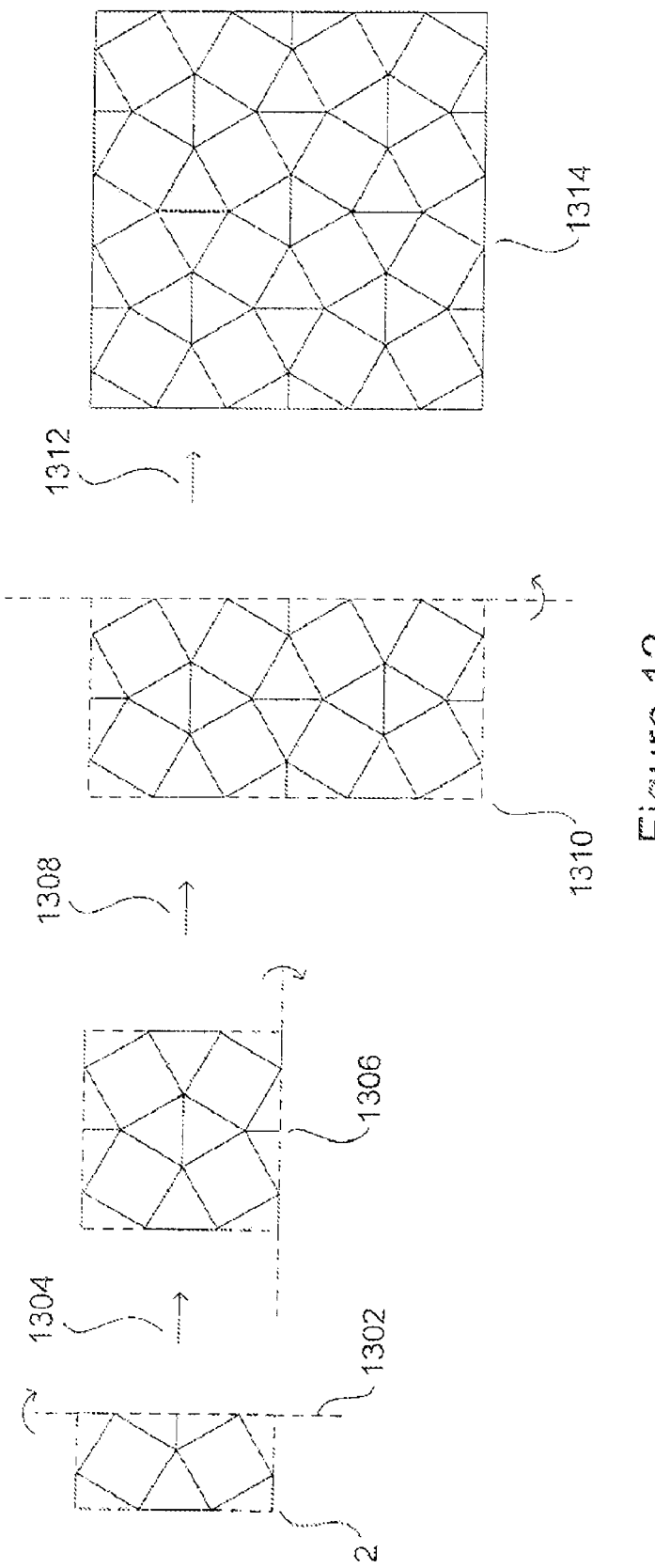
FIG. 13 illustrates how the fundamental unit identified in FIG. 12 can be used to regenerate an entire tiling.

FIG. 13 illustrates how the fundamental unit identified in FIG. 12 can be used to regenerate an entire tiling. Starting with the fundamental unit 1202, as shown on the left-hand side of FIG. 13, a series of mirroring operations, where a mirror is represented by a two-fold rotation axis 1302 lying in the plane of the tiling along an edge of the fundamental unit 1202, can produce an arbitrarily sized tiling. A first mirroring operation 1304 produces a two-fundamental-unit-sized tiling 1306, which can be mirrored by a second mirroring operation 1308 to produce a tiling 1310 of twice that area, including four fundamental units. This tiling can, in turn, be mirrored 1312 to produce a tiling that includes eight fundamental units 1314. The process can be continued to generate a tiling of arbitrary size.

Figure 14:
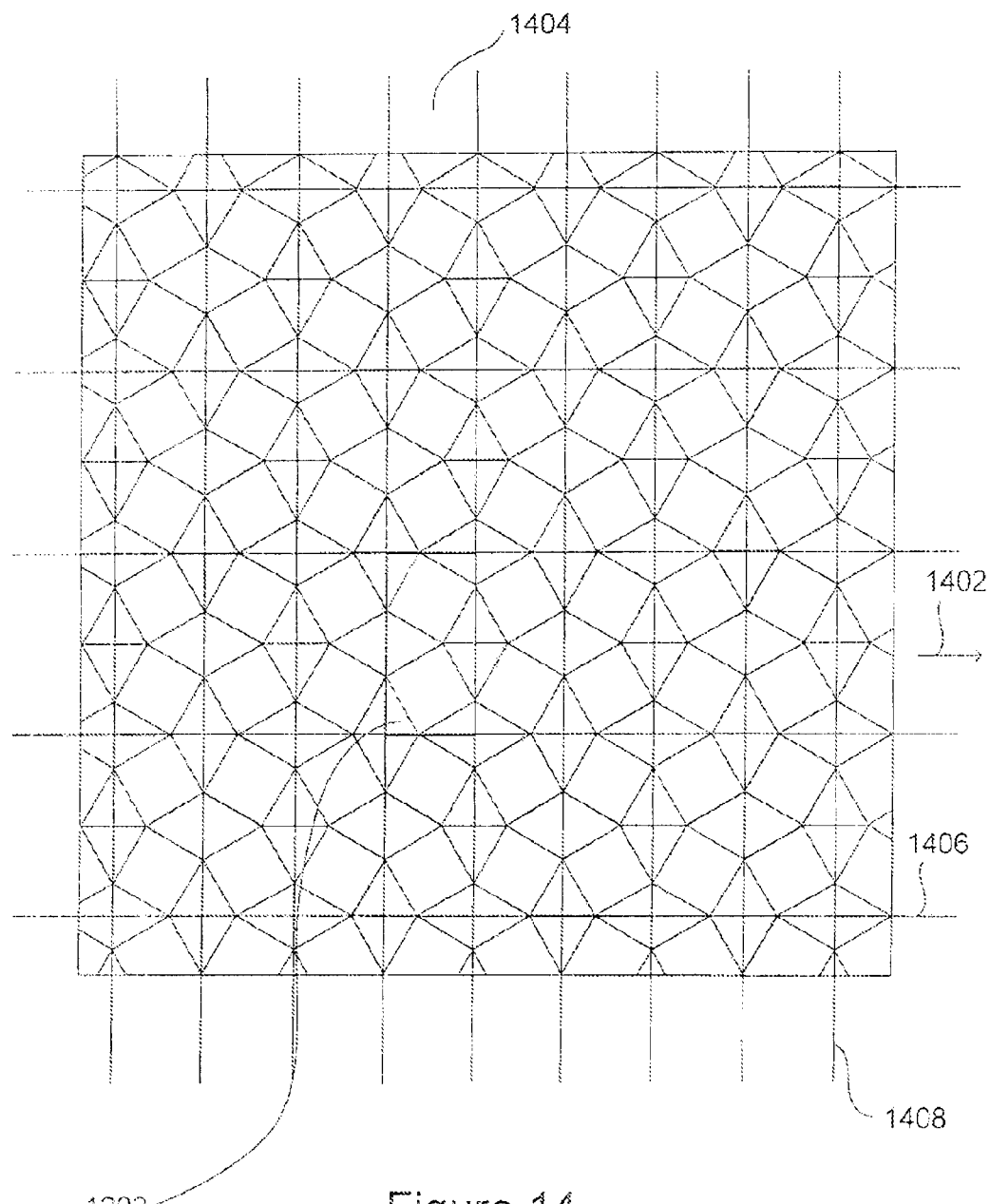
FIG. 14 illustrates repeating of the fundamental unit across a tiling.

FIG. 14 illustrates repeating of the fundamental unit across a tiling. As shown in FIG. 14, the fundamental unit 1202 identified in FIG. 12 repeats in both a horizontal direction 1402 and a vertical direction 1404 to generate the entire tiling. In other words, the surface is completely tiled by fundamental units, and that fundamental-unit tiling generates a regular grid or lattice, shown in FIG. 14, by horizontal lines, such as horizontal line 1406, and vertical lines, such as vertical line 1408, superimposed over the tiling.

Figure 15A:
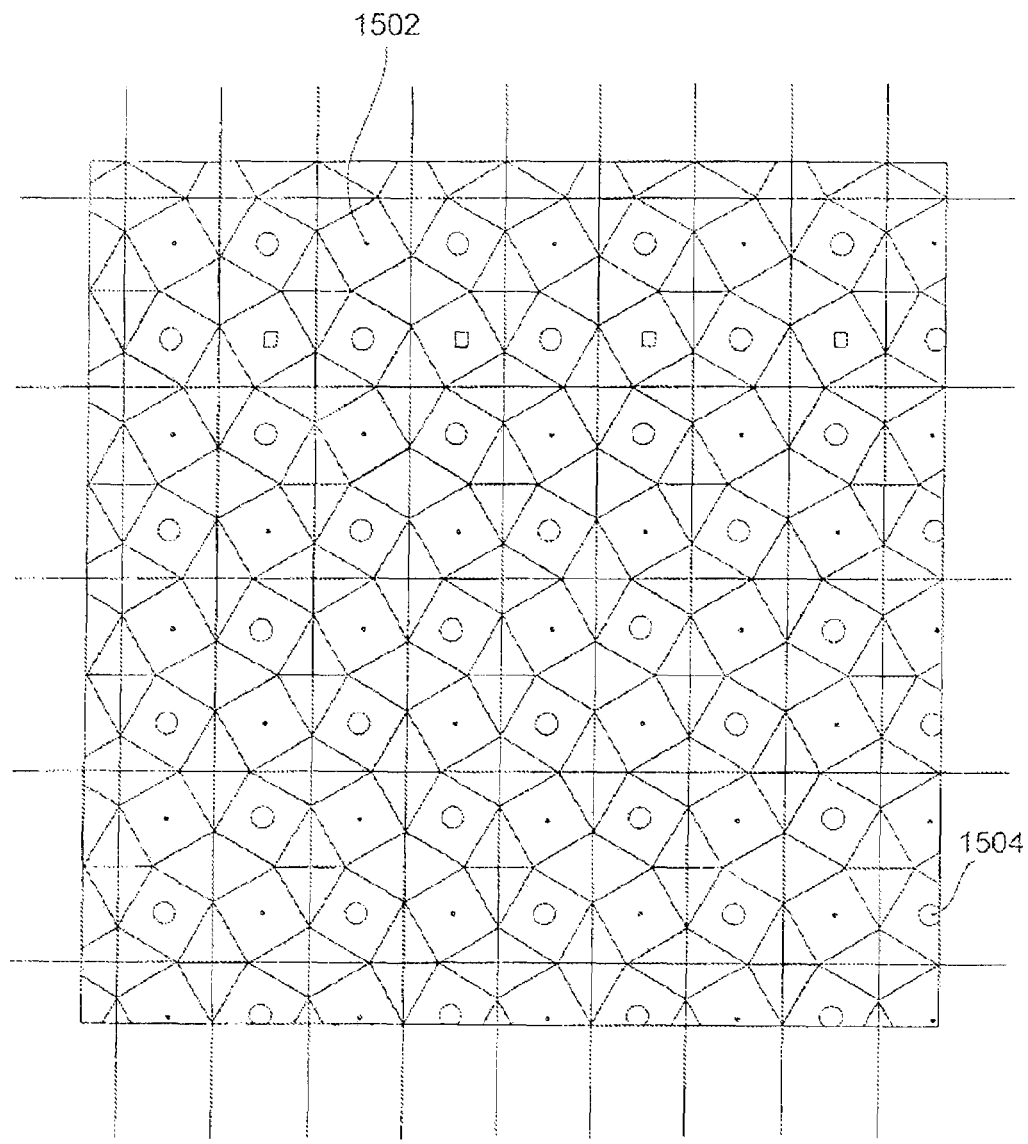
FIGS. 15A-B illustrate a microscale-layer pin configuration, based on the tiling shown in FIG. 11, which represents an embodiment of the present invention.
Figure 15B:
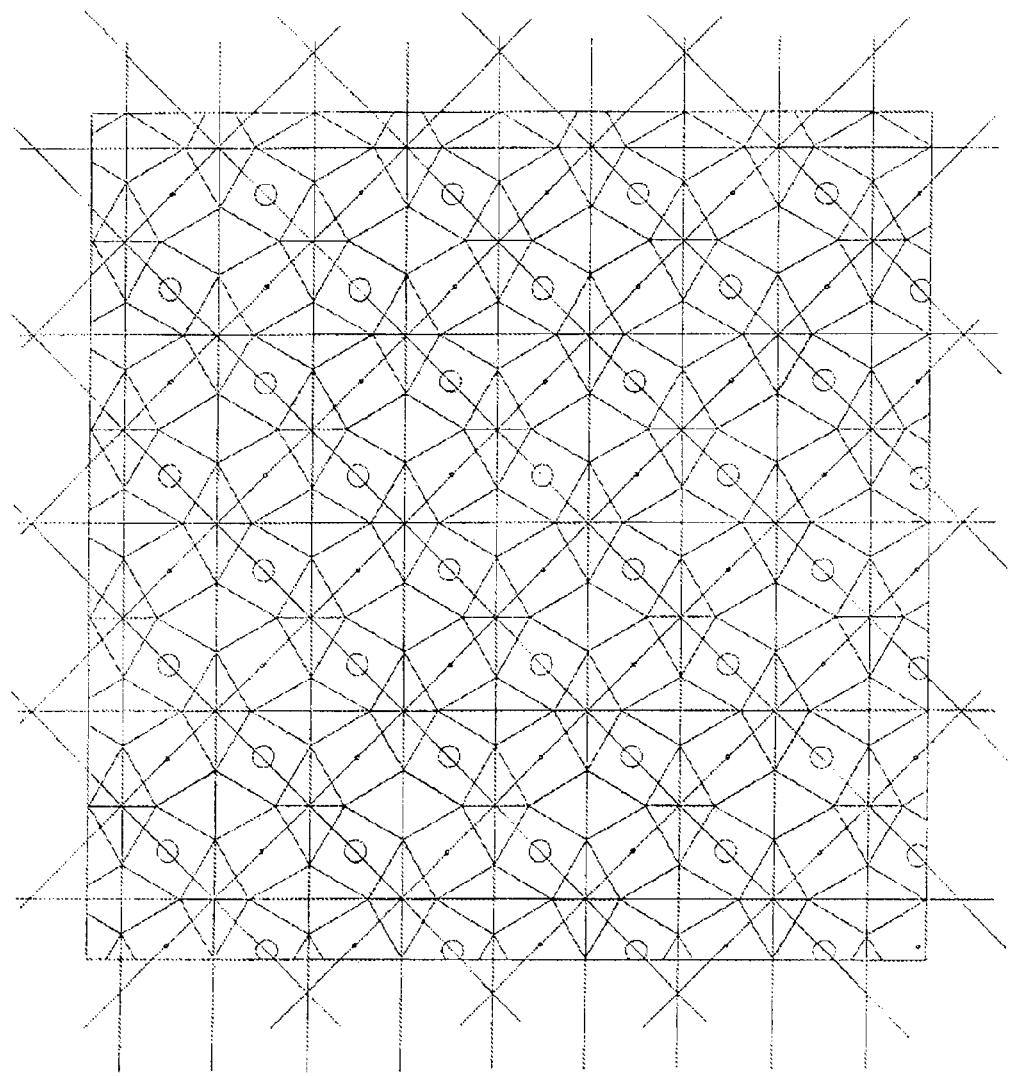

FIGS. 15A-B illustrate a microscale-layer pin configuration, based on the tiling shown in FIG. 11, which represents an embodiment of the present invention. Were the tiling described with reference to FIGS. 11-14 employed as the organization of a microscale substrate, as discussed above, then, for example, as shown in FIG. 15A, one set of pins could be centered on each of the squares with a first orientation, represented by small, shaded disks, such as small, shaded disk 1502 in FIG. 15, and another set of pins, shown in FIG. 15 as unfilled disks, such as unfilled disk 1504, could be centered on each of the squares with a second orientation. These two different types of pins then define a grid, as shown in FIG. 15B, along which PINU bundles can be oriented to produce a two-layer nanoscale interface, as discussed above.

Figure 16D:
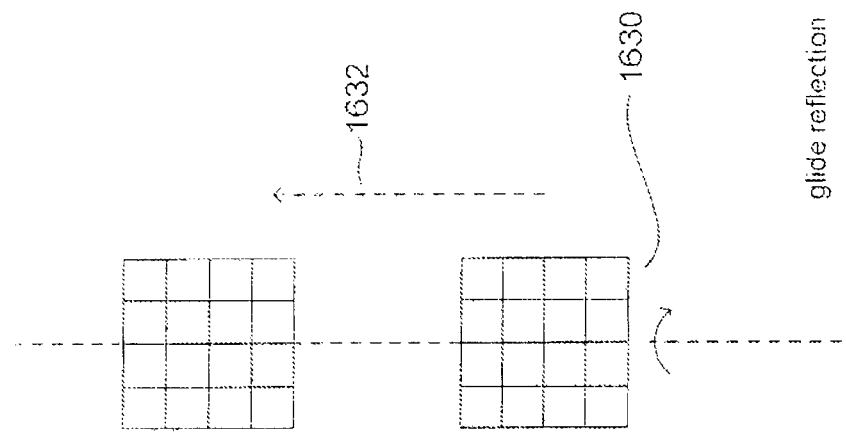
Figure 16C:
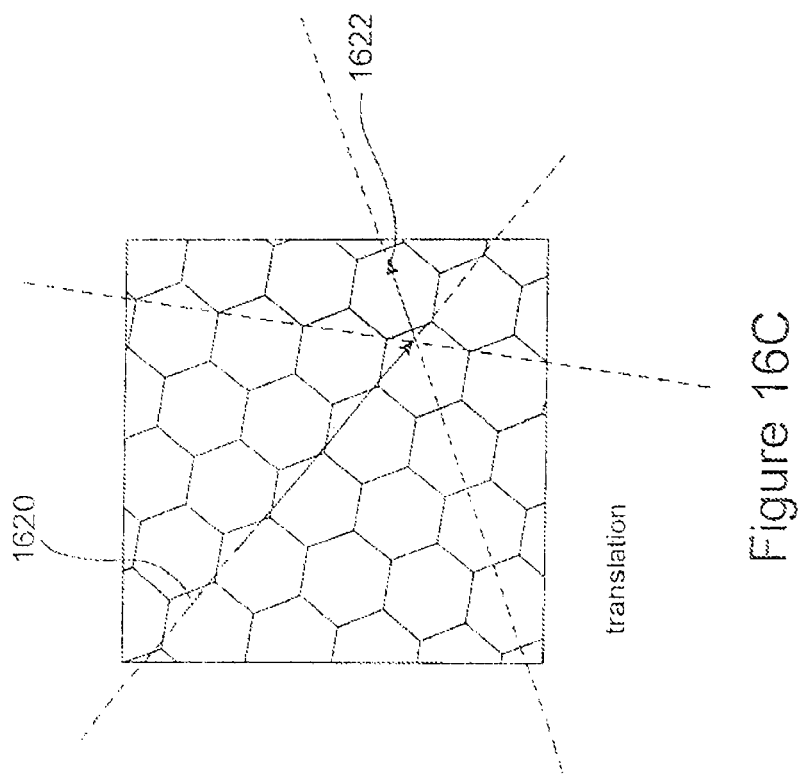

While the symmetry present within various types of tiling may appear complex, all possible periodic-tiling symmetries can be mathematically generated from a small set of fundamental symmetry operations, just as tilings are generated from a small set of prototiles. FIGS. 16A-D illustrate one small set of symmetry operations that can be used, in combination, to generate the overall symmetry of any possible periodic tiling. These symmetry operations include: (1) mirror-plane symmetry, illustrated in FIG. 16A; (2) rotation axes, an example of which is illustrated in FIG. 16B; (3) translation, an example of which is illustrated in FIG. 16C; and (4) glide reflection, illustrated in FIG. 16D. Symmetry operations can be described mathematically as matrix operations, and different tiling symmetries can be described as mathematical groups defined by the small set of symmetry operations that generate them. Thus, a tiling symmetry is generated by all possible mathematical combinations, such as matrix multiplications, of the elementary symmetry operations that define the group corresponding to the tiling symmetry. Tiling symmetries are described using notation devised by the International Union of Crystallographers ("IUC"). The notation indicates a smallest set of elementary symmetry operations, and their respective orientations, that generate the tiling symmetry.

As discussed above, a mirror plane can be thought of as a two-fold rotation axis lying in the plane of a tiling. All of the tiles, in their respective orientations, on one side of the rotation axes are copied and rotated 180° about the two-fold rotation axis to generate a mirror-image copy. For example, in FIG. 16A, the left-hand portion of the tiling 1602 is copied and rotated about the mirror plane 1604 to produce a right-hand, mirror-image portion 1606.

As shown in FIG. 16B, a rotation axis 1608 is, for the purposes of discussing symmetry of plane tilings, an axis perpendicular to the plane of a tiling 1610. In general, rotation axes pass through specific points relative to the lattice that describes a periodic tiling, just as mirror planes are oriented along particular directions and at specific intervals with respect to the lattice corresponding to a tiling. For a simple, square tiling 1610, each vertex, such as vertex 1612, can be thought of as lying on a four-fold rotation axis. This means that, as shown in FIG. 16B, the tiling can be rotated by angles of n90°, where n is any integer, about the rotation axis to produce an identical tiling. For periodic, plane tilings, only two-fold, three-fold, four-fold, and six-fold rotation axes need be considered.

As shown in FIG. 16C, a translation means that a tiling can be shifted along any lattice direction, where lattice directions correspond to the directions of the lattice lines, by any number of fundamental-unit dimensions corresponding to that lattice direction to produce an equivalent tiling. Another way of looking at translation is that if one chooses an arbitrary point, such as point 1620 in FIG. 16C, and moves that point along lattice directions by arbitrary numbers of fundamental-unit dimensions in those lattice directions, an equivalent point 1622, or, in other words, a point, having exactly the same environment with respect to neighboring tiles in the tiling as the original point, is obtained. Finally, FIG. 16B illustrates the glide-reflection symmetry element. A glide-reflection symmetry element constitutes a mirroring operation 1630 followed by a translation 1632 to produce an equivalent tiling.

Figure 17:
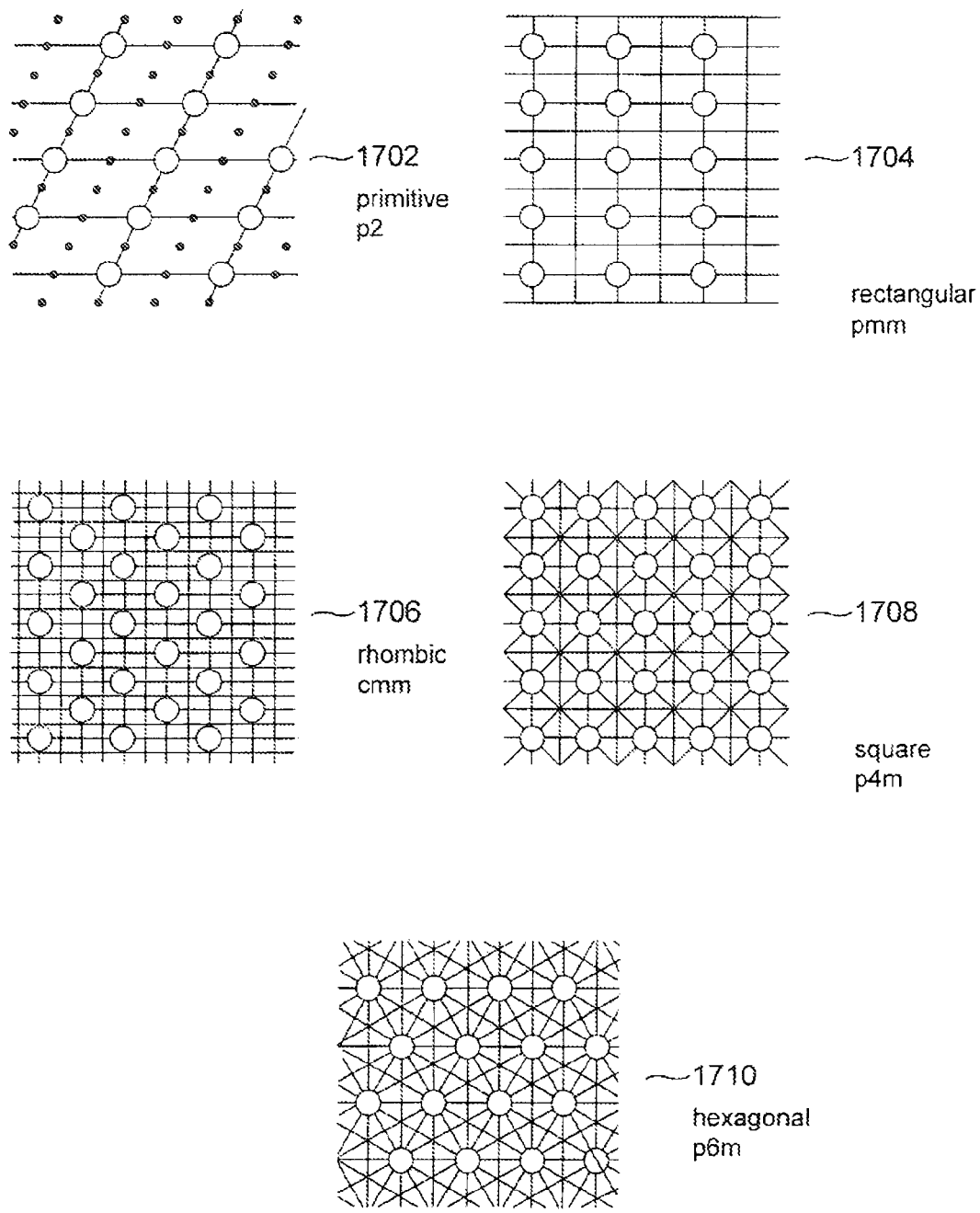
FIG. 17 illustrates these five different types of lattices.

It turns out that, when all of the different possible periodic tilings are considered, there are only five different lattice symmetries possible, each defined by a small combination of symmetry operations. FIG. 17 illustrates these five different types of lattices. They include a primitive lattice 1702 having tiling symmetry "p2," a generating-symmetry-element set for which includes only two-fold axes, a rectangular lattice 1704 having tiling symmetry "pmm," generated by orthogonal mirror symmetry elements, a rhombic lattice 1706 having tiling symmetry "cmm," a square lattice 1708 having tiling symmetry "p4m," and a hexagonal lattice 1710 having tiling symmetry "p6m". All possible periodic titles have lattices that fall into one of these five different symmetry classes for lattices.

Figure 18:
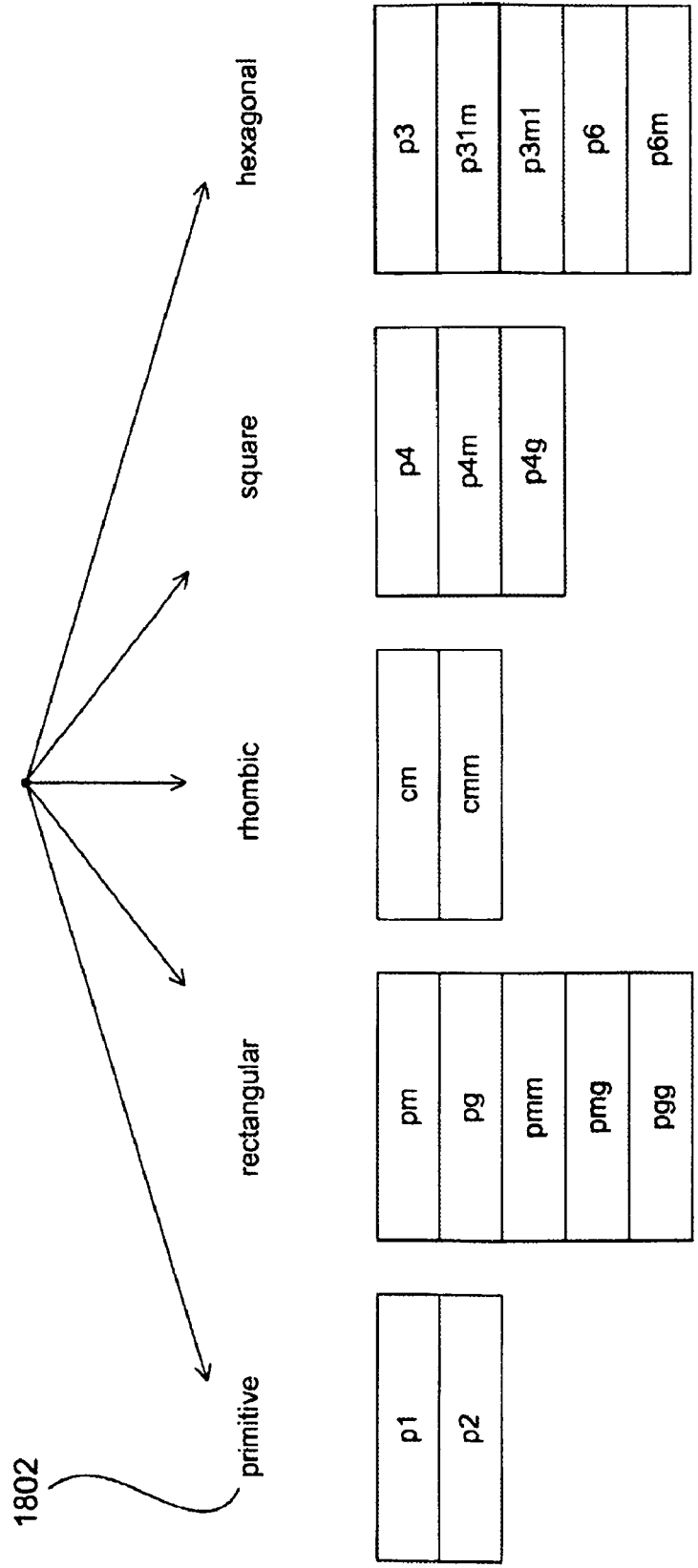
FIG. 18 shows seventeen different types of periodic-tiling symmetries.

FIG. 18 shows the seventeen different types of periodic-tiling symmetries. As discussed above, the lattices of all possible periodic tilings fall into five different lattice-symmetry classes 1802, shown along a horizontal direction in FIG. 18. For each type of lattice, there are only a small number of different possible tiling symmetries, shown in a column below each lattice symmetry.

There are many reasons for choosing a particular type of lattice and tiling symmetries for designing nanoscale/microscale interfaces, and, in particular, the tiling of the microscale substrate with respect to pins. A first consideration is that, in many cases, a microscale substrate comprises a crystalline material that has a particular symmetry corresponding to a tiling-lattice symmetry and tiling symmetry. In many cases, physical operations used to manufacture microscale circuitry and nanoscale-layer sub-layers are most effectively employed when the circuitry has a fixed orientation with respect to the symmetry of the crystalline microscale substrate. Thus, one may wish to use, for a tiling symmetry that describes pin placement on a microscale substrate, a lattice symmetry that corresponds to the lattice symmetry of the underlying crystalline material.

Figure 19A:
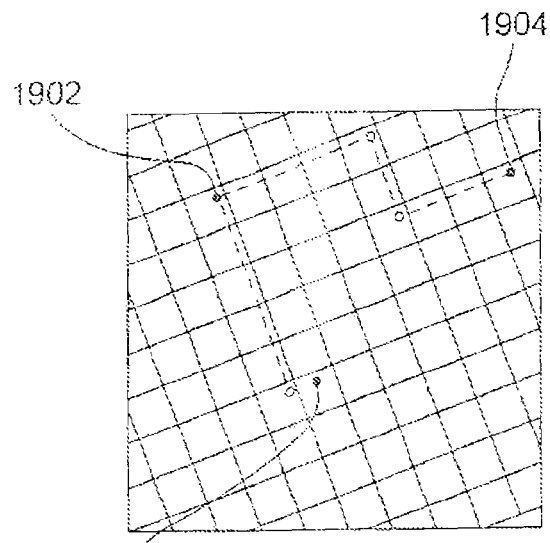
FIGS. 19A-B illustrate small portions of a square tiling and a hexagonal tiling, respectively.
Figure 19B:
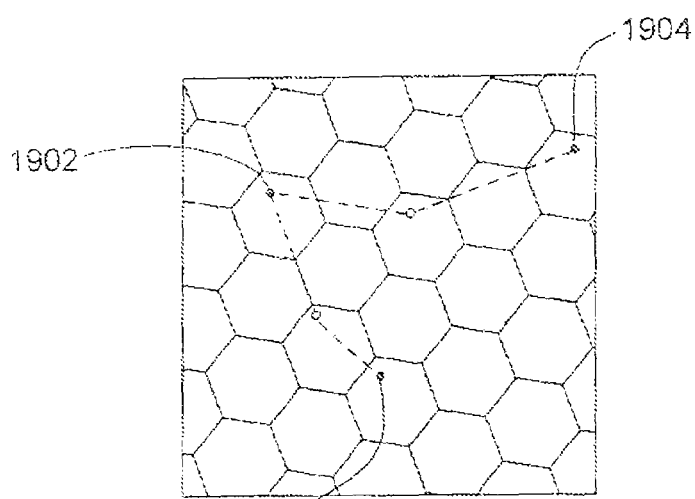

A second consideration involves density of interconnection in the path length for signal propagation within the nanoscale interface. FIGS. 19A-B illustrate small portions of a square tiling and a hexagonal tiling, respectively. Three arbitrary points 1902, 1904, and 1906 are selected on the surface that is to be tiled in both FIGS. 19A and 19B. These three arbitrary points are interconnected by translations along the lattice directions, through intermediate points necessary to construct a path between the three arbitrary points. A constraint is that all of the paths must lie within the small portion of the substrate shown in FIGS. 19A and 19B. As can be seen by comparing FIG. 19A to 19B, the hexagonal tiling, shown in FIG. 19B, provides for shorter path lengths and less intermediate interconnection points for connecting the three arbitrary points. In examining the different types of lattice symmetries shown in FIG. 17, it is readily observed that the high-symmetry hexagonal lattice provides for much higher density of interconnection, and much shorter, average path lengths, in general, than provided by the low-symmetry primitive lattice 1702. Of course, the path lengths also depend on the lattice dimensions. However, for lattices with similar fundamental-unit dimensions, the hexagonal lattice provides for higher density of interconnection and therefore greater flexibility in constructing paths between arbitrary points on the microscale surface, as well as shorter average path lengths between points on the surface of the microscale layer.

Yet another consideration involves the number of pins, and types of pins, that one may wish to include in each fundamental unit, or tile, of a microscale/substrate tiling. For example, if a three-pin fundamental unit is desired, with two input pins and a single output pin for each fundamental unit, then a hexagonal tiling may be the appropriate choice, with the two input pins and one output pin orientated by a three-fold rotation axis coincident with the six-fold rotation axis that passes through the center of each hexagonal tile of the hexagonal tiling. In general, it is desirable for the positions of pins within a fundamental unit to be related by one or two symmetry elements, and for those symmetry elements to coincide with symmetry elements of the tiling lattice. By doing so, pins end up positioned in rows along lattice directions. In other words, the number and types of pins to be included in each fundamental unit of a microscale substrate may dictate certain choices of lattice symmetries and tiling symmetries.

Figure 20:
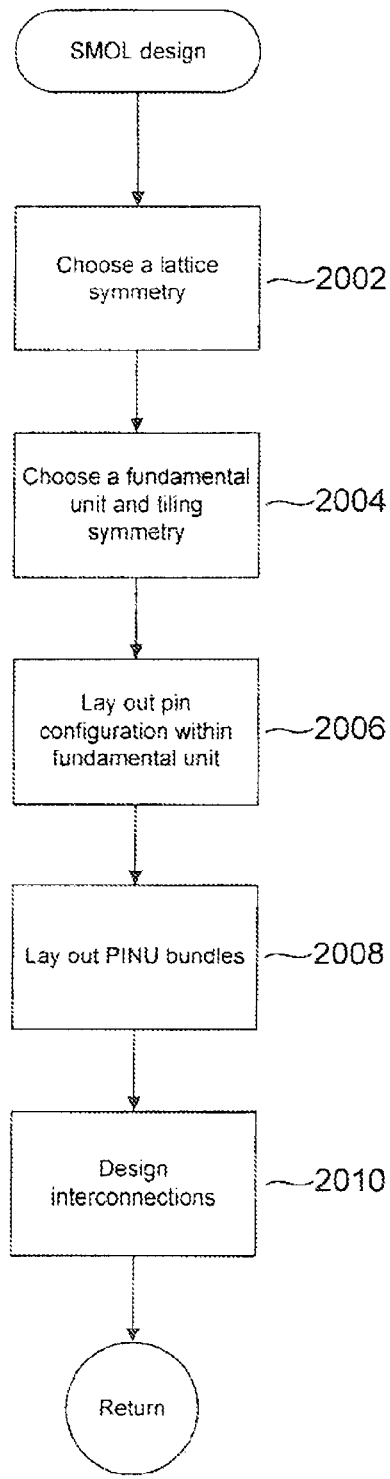
FIG. 20 is a simple control-flow diagram that illustrates a nanoscale/microscale-interface design methodology that represents an embodiment of the present invention.

FIG. 20 is a simple control-flow diagram that illustrates a nanoscale/microscale-interface design methodology that represents an embodiment of the present invention. In designing a nanoscale/microscale interface, a tiling-lattice symmetry may be first selected, in step 2002, according to various considerations, including the considerations mentioned above. The density of interconnection, path length, number and type of pins within each fundamental unit, and symmetry of the underlying microscale crystalline substrate can all be considered in order to choose an appropriate tiling-lattice symmetry. Next, in step 2004, a tiling symmetry and fundamental unit is chosen. For nanoscale/microscale interface design, it may be reasonable to restrict choices of fundamental units and tiling symmetries to polygonal fundamental units and relatively simple tiling symmetries, involving only mirror planes and rotation axes. Next, in step 2006, the pin configuration is laid out within the fundamental unit. Then, in step 2008, PINU bundles can be oriented in directions coincident with lines overlying different sets of pins. In many cases, PINU bundles will be oriented along lattice directions, or at regular angles, such as 30°, 45°, and 60°, to lattice directions. Finally, in step 2010, the interconnections between PINUs are designed in order to create desired connection paths between pins of the microscale substrate. In the case of hexagonal tilings, for example, a three-nanoscale-layer architecture may be desirable, with PINUs directed along three lattice directions at 60° angles from one another. The manufacturing process, described above with reference to FIGS. 7A-T, may be straightforwardly extended to generate an additional nanoscale-interface layer, with careful attention to fabricating interconnections that span only those nanoscale-layer sub-layers needed to interconnect PINUs and to connect PINUs to pins without inadvertently shorting other connections. In a three-sub-layer implementation, for example, interconnections need to be made between the following pairs of sub-layers: {1, 2}, {1, 3}, and {1,3}.

Figure 21A:
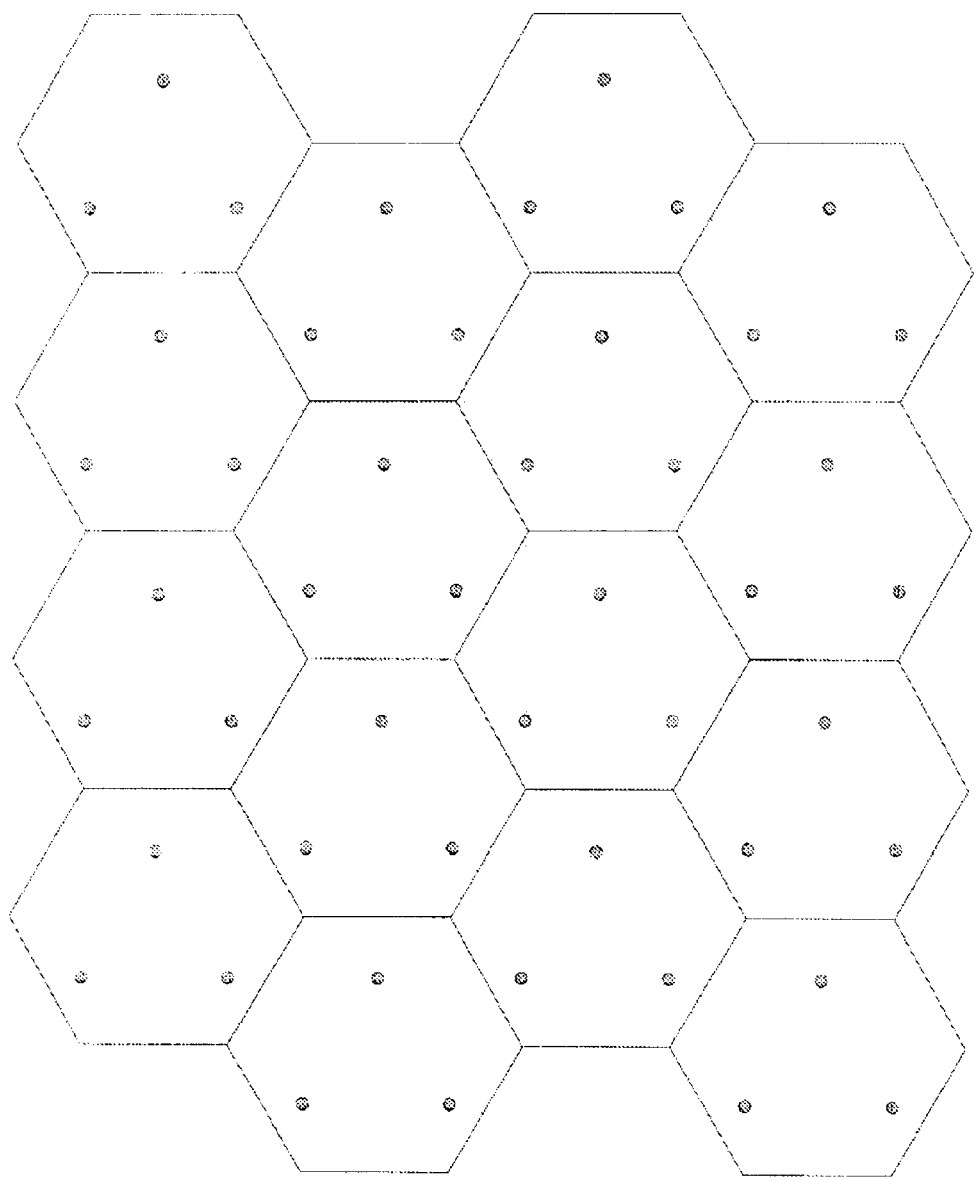
FIGS. 21A-C illustrate a hexagonal-tiling-based nanoscale/microscale interface that represents an embodiment of the present invention.
Figure 21B:
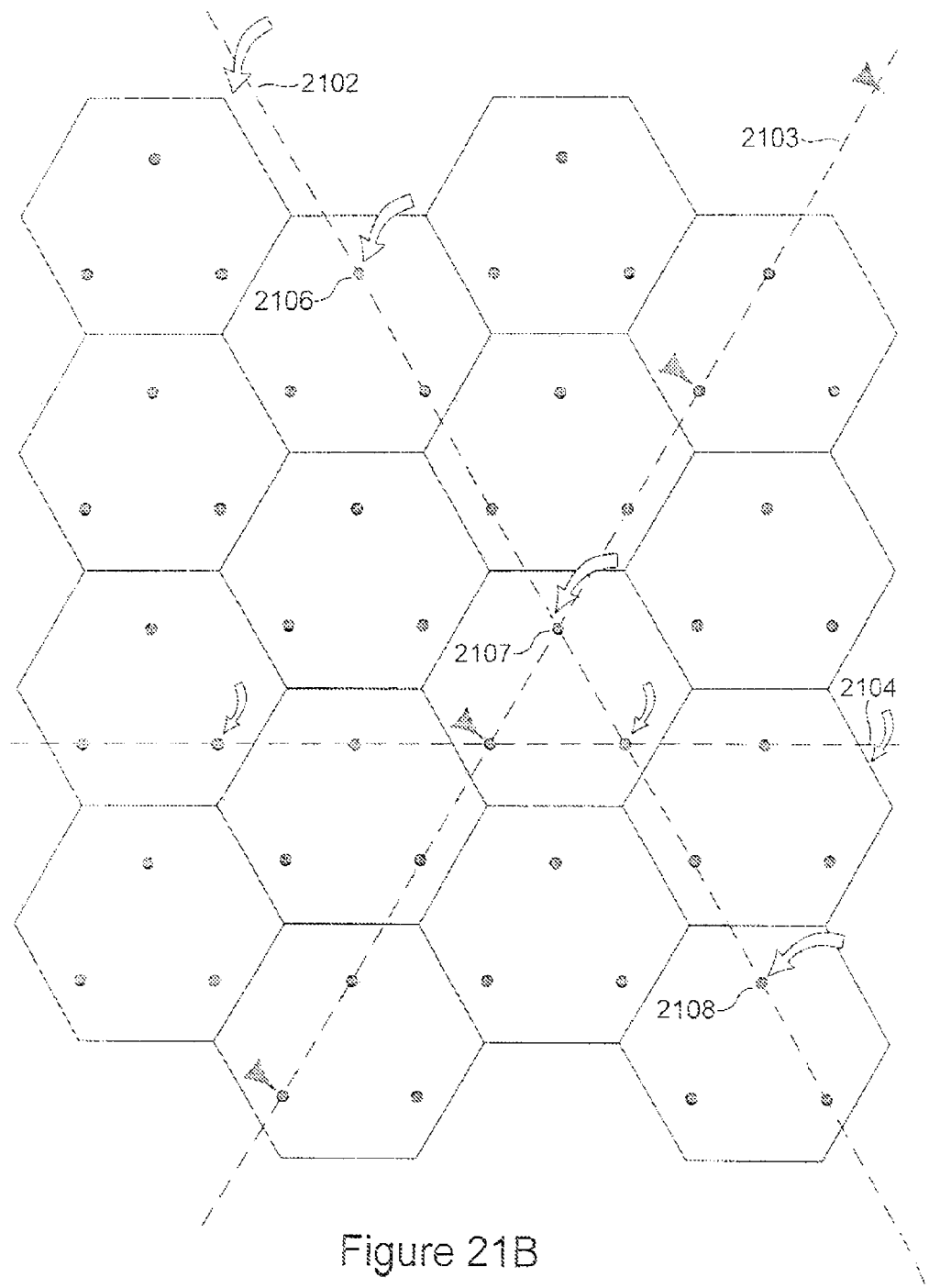
Figure 21C:
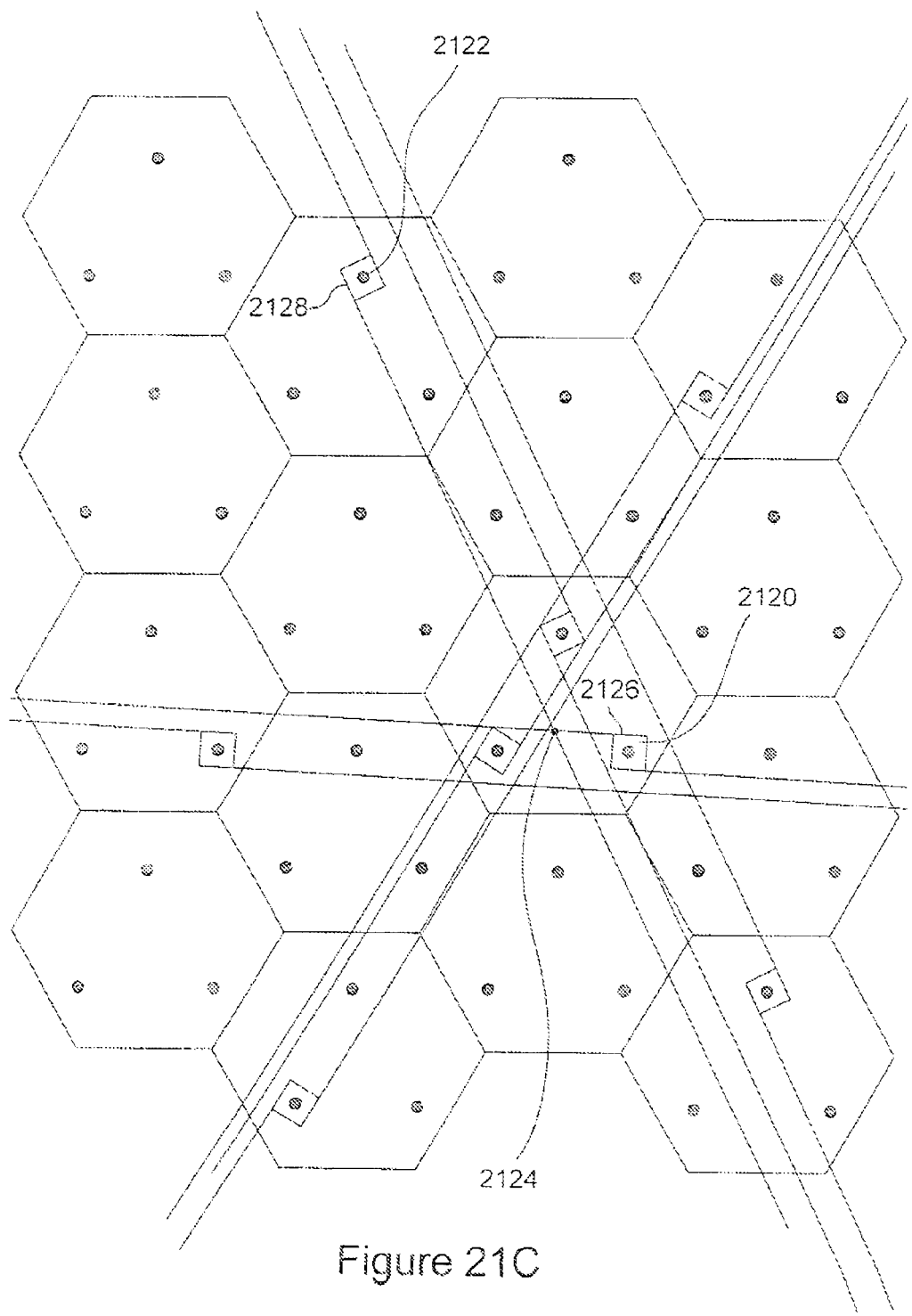

FIGS. 21A-C illustrate a hexagonal-tiling-based nanoscale/microscale interface that represents an embodiment of the present invention. As shown in FIG. 21A, the microscale substrate is configured with respect to a hexagonal tiling, with three pins per tile. As shown in FIG. 21B, PINU-bundle directions 2102-2104 are laid out over the hexagonal tiling in order to interconnect different sets of pins. Pins 2106-2108, for example, are connected to other pins via PINUs along direction 2102. FIG. 21C shows three different PINU bundles oriented along the directions shown in FIG. 21B. If, for example, pin 2120 is an output pin, and pin 2122 is an input pin, a connection between the two pins can be achieved by a nanowire junction 2124 interconnecting the nanowires of PINU 2126 and PINU 2128, respectively. The hexagonal-tiling-based nanoscale/microscale interface includes three different nanoscale-layer sub-layers, each corresponding to, and including PINU bundles oriented parallel to, one of the three lattice directions. Each nanoscale-layer sub-layer has a PINU-bundle direction different from the other two nanoscale-layer sub-layers.

Thus, the nanoscale/microscale-interface-design method of the present invention can be used to fabricate any of an essentially limitless number of different tilings. Automated nanoscale/microscale-design methods to produce essentially arbitrary interconnection between arbitrary fundamental units of the nanoscale/microscale interface can employ the design methodology discussed with reference to FIG. 20, using only monohedral, polygonal tilings with tile dimensions spanning relatively limited ranges.

Although the present invention has been described in terms of particular embodiments, it is not intended that the invention be limited to these embodiments. Modifications within the spirit of the invention will be apparent to those skilled in the art. For example, monohedral, periodic tilings with regular-polygon-shaped fundamental units are perhaps most useful for nanoscale/microscale interfaces, other types of tilings may also be used. The prototiles for the tilings may have arbitrarily sized dimensions, as required for including the microelectronic components that correspond to each tile.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale/microscale interface having a microscale layer and a predominantly nanoscale layer, the nanoscale/microscale interface comprising:
  a microscale-layer substrate;
  microelectronic circuits fabricated on the microscale-layer substrate, the microelectronic circuits connected to a number of pins exposed on a surface microscale-layer, the pins partitioned into groups of pins, each group of pins configured identically within a fundamental unit, the fundamental units arranged to tile the surface microscale-layer according to a lattice symmetry; and
  a number of nanoscale-layer sub-layers, each nanoscale-layer sub-layer containing regularly spaced, parallel pad-interconnected-nanowire-unit (PINU) bundles.

2. The nanoscale/microscale interface of claim 1 wherein the lattice symmetry is one of:
  primitive;
  rectangular;
  rhombic;
  square; and
  hexagonal.

3. The nanoscale/microscale interface of claim 1 wherein the fundamental units are regular polygons.

4. The nanoscale/microscale interface of claim 1 wherein each PINU bundle in a particular nanoscale-layer sub-layer has the same direction as a lattice direction of the lattice symmetry.

5. The nanoscale/microscale interface of claim 1 wherein each PINU bundle in each nanoscale-layer sub-layer has the a direction equal to an angle of 30°, 45°, or 60° added to a lattice direction of the lattice symmetry.

6. The nanoscale/microscale interface of claim 1 wherein the direction of the PINU bundles in each nanoscale layer sub-layer is different from the directions of the PINU bundles in all other nanoscale layer sub-layers.

7. The nanoscale/microscale interface of claim 1 wherein the pins in each fundamental unit are symmetrically related by one or two elementary symmetry operations.

* * * * *

UNITED STATES PATENT AND TRADEMARK OFFICE
CERTIFICATE OF CORRECTION

| | | |
|---|---|---|
| PATENT NO. | : 7,692,215 B2 | Page 1 of 1 |
| APPLICATION NO. | : 11/701086 | |
| DATED | : April 6, 2010 | |
| INVENTOR(S) | : Williams et al. | |

It is certified that error appears in the above-identified patent and that said Letters Patent is hereby corrected as shown below:

In column 18, line 19, in Claim 5, before "direction" delete "a".

Signed and Sealed this

Ninth Day of November, 2010

David J. Kappos
*Director of the United States Patent and Trademark Office*